United States Patent
Simmons et al.

(10) Patent No.: US 12,236,318 B2
(45) Date of Patent: Feb. 25, 2025

(54) SYSTEMS, DEVICES, ARTICLES, AND METHODS TO INTERACT WITH INFORMATION STORED IN BOUND-EXCITON STATES ASSOCIATED WITH LUMINESCENT SILICON DEFECTS

(71) Applicant: PHOTONIC INC., Coquitlam (CA)

(72) Inventors: Stephanie Simmons, Burnaby (CA); Michael L. W. Thewalt, Vancouver (CA)

(73) Assignee: PHOTONIC INC., Coquitlam (CA)

( * ) Notice: Subject to any disclaimer, the term of this patent is extended or adjusted under 35 U.S.C. 154(b) by 428 days.

(21) Appl. No.: 17/596,669

(22) PCT Filed: Aug. 6, 2020

(86) PCT No.: PCT/CA2020/051077
§ 371 (c)(1),
(2) Date: Dec. 16, 2021

(87) PCT Pub. No.: WO2021/022375
PCT Pub. Date: Feb. 11, 2021

(65) Prior Publication Data
US 2022/0327416 A1  Oct. 13, 2022

Related U.S. Application Data

(60) Provisional application No. 62/883,598, filed on Aug. 6, 2019.

(51) Int. Cl.
*G06N 10/60* (2022.01)
*G06N 10/20* (2022.01)
(Continued)

(52) U.S. Cl.
CPC ............. *G06N 10/60* (2022.01); *G06N 10/20* (2022.01); *G06N 10/40* (2022.01); *H01L 21/18* (2013.01); *H01L 29/02* (2013.01)

(58) Field of Classification Search
CPC ... H01L 21/324; H01L 21/2633; H01L 29/02; H01L 29/04; H01L 29/122; G06N 10/40; G06N 10/60; G06N 10/70
See application file for complete search history.

(56) References Cited

U.S. PATENT DOCUMENTS 3,434,894 A    3/1969 Gale

FOREIGN PATENT DOCUMENTS

| WO | 2017089891 A1 | 6/2017 |
| WO | 2019224789 A1 | 11/2019 |

OTHER PUBLICATIONS

Lo et al. Hybrid optical-electrical detection of donor electron spins with bound excitons in silicon, Mar. 23, 2015, Nature Materials, vol. 14, pp. 490-494 (Year: 2015).*

(Continued)

*Primary Examiner* — Wyatt A Stoffa
*Assistant Examiner* — Samanvitha Sridhar
(74) *Attorney, Agent, or Firm* — Oyen Wiggs Green & Mutala LLP

(57) ABSTRACT

Various systems, devices, articles and methods related to one or more local luminescent defects disposed within semiconductor body including silicon. A respective defect included in the one or more defects supports a respective bound exciton. A respective pair of computational states is defined at the respective defect and one computational state of the pair of computational states includes a first configuration for the respective exciton. Information stored in the respective pair of computational states can be manipulated according to various systems, devices, articles and methods described herein.

22 Claims, 15 Drawing Sheets

(51) Int. Cl.
G06N 10/40 (2022.01)
H01L 21/18 (2006.01)
H01L 29/02 (2006.01)

(56) References Cited

OTHER PUBLICATIONS

Yang et al., Optical Detection and Ionization of Donors in Specific Electronic and Nuclear Spin States, Dec. 1, 2006, PRL 97, 227401, pp. 1-4 (Year: 2006).*

Safonov et al., Interstitial-Carbon Hydrogen Interaction in Silicon, Dec. 2, 1996, PRL 77, 23, pp. 4812-4815 (Year: 1996).*

NKT Photonics Datasheet: Kooheras Boostik Fiber Amplifier Module (Year: 2015).*

Chartrand, C. et al., "Highly enriched 28Si reveals remarkable optical linewidths and fine structure for well-known damage centers", arxiv.org, Cornell University Library, Jul. 27, 2018.

Éthier-Majcher, G. et al., "Complete quantum control of exciton qubits bound to isoelectronic centers", Nature Communcations, vol. 5, No. 1, May 30, 2014.

Poem, E. et al., "Polarization memory in single Quantum Dots", arxiv.org, Cornell University Library, Feb. 25, 2009.

Saeedi, K. et al., "Room-Temperature Quantum Bit Storage Exceeding 39 Minutes Using Ionized Donors in Silicon-28", Science, vol. 342, No. 6160, Nov. 15, 2013.

Morton, J.L. et al., "Embracing the quantum limit in silicon computing", Nature, vol. 479, Nov. 17, 2011.

Akhlaghi, M.K. et al., "Waveguide integrated superconducting single-photon detectors implemented as near-perfect absorbers of coherent radiation", Nature Communications 6: 8233 (2015).

Eisaman, M.D. et al., "Invited Review Article: Single-photon sources and detectors", Rev. Sci. Instrum. 82, 071101 (2011).

Davies, G., Physics Reports 176: 83-188 (1989).

Hartmann, S.R. et al., "Nuclear Double Resonance in the Rotating Frame", Phys. Rev. 128:2042-2053 (1962).

Fu, K.-M. C. et al., "Ultrafast control of donor-bound electron spins with single detuned optical pulses", Nature Physics 4, 780-784 (2008).

Clark, S. M. et al., "Quantum computers based on electron spins controlled by ultra-fast, off-resonant, single optical pulses", arXiv:quant-ph/0610152v3, Jun. 11, 2007.

Yamamoto, Y. et al., "Optically controlled semiconductor spin qubits for quantum information processing", Phys. Scr. 014010 (2009).

Stoneham, A. M. et al., "Optically driven silicon-based quantum gates with potential for high-temperature operation", J. Phys.: Condens. Matter 15 L447 (2003).

* cited by examiner

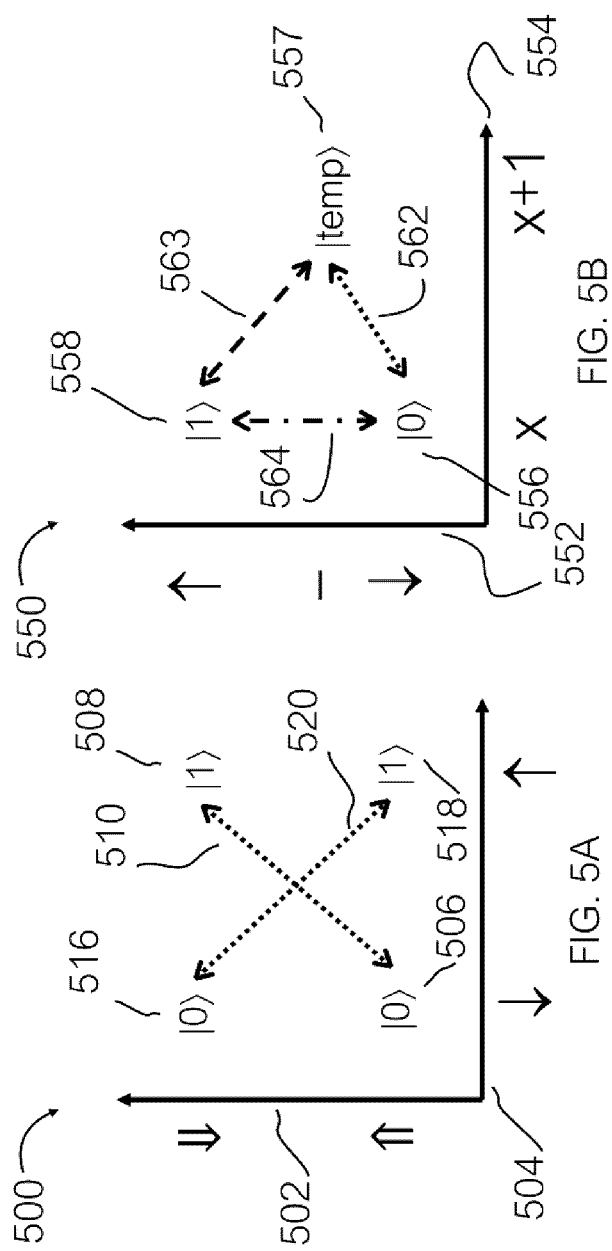

SYSTEMS, DEVICES, ARTICLES, AND METHODS TO INTERACT WITH INFORMATION STORED IN BOUND-EXCITON STATES ASSOCIATED WITH LUMINESCENT SILICON DEFECTS

CROSS-REFERENCE TO RELATED APPLICATIONS

This application claims priority from U.S. application No. 62/883,598 filed 6 Aug. 2019 entitled SYSTEMS, DEVICES, ARTICLES, AND METHODS TO INTERACT WITH INFORMATION STORED IN BOUND-EXCITON STATES ASSOCIATED WITH LUMINESCENT SILICON DEFECTS which is hereby incorporated herein by reference for all purposes. For purposes of the United States of America this application claims the benefit under 35 U.S.C. § 119 of U.S. application No. 62/883,598 filed 6 Aug. 2019 entitled SYSTEMS, DEVICES, ARTICLES, AND METHODS TO INTERACT WITH INFORMATION STORED IN BOUND-EXCITON STATES ASSOCIATED WITH LUMINESCENT SILICON DEFECTS which is hereby incorporated herein by reference for all purposes.

FIELD

The present disclosure relates to quantum information processing operations for computational states including two or more local configuration states of defects in semiconductor material (e.g., local luminescent defects in silicon).

BACKGROUND

Information is contained in the state of a physical system. The physical system may be a quantum system or a classical system. Systems include tangible devices such as electrical components defined on or within one or more substrates. The physical system may include one or more photons that may interact with or otherwise communicatively couple other physical components.

SUMMARY

Further aspects and example embodiments are illustrated in the accompanying drawings and/or described in the following description.

An information processing device including a semiconductor body, including silicon, and one or more local luminescent defects disposed within the semiconductor body. A respective local luminescent defect included in the one or more local defects supports a respective bound exciton. The respective local luminescent defect includes a first computational state and a second computational state. The first computational state includes a first configuration for the respective exciton. The device further including a control system, which includes circuitry, communicatively coupled to the semiconductor body and in response to execution of processor-executable instructions manipulates the one or more local luminescent defects.

A system including an information processing device which includes a semiconductor body, consisting principally of silicon, and one or more local luminescent defects disposed within the semiconductor body. A respective local luminescent defect included in the one or more local luminescent defects supports a respective bound exciton. The respective local luminescent defect includes a first computational state and a second computational state. The first computational state includes a first configuration for the respective exciton. A system further includes a control subsystem, including circuitry, communicatively coupled to the semiconductor body and in response to execution of processor-executable instructions manipulates the one or more local luminescent defects. A system further includes at least one processor communicatively coupled to the control system, and at least one tangible computer-readable storage device communicatively coupled to the at least one processor and which stores processor-executable instructions. The processor-executable instructions, when executed by the at least one processor, cause the at least one processor to direct the control subsystem to initialize the one or more local luminescent defects in the first computational state or the second computational state.

An information processor substantially as described and illustrated herein.

A system including at least one processor and a quantum information processor substantially as described and illustrated herein.

A method of operation of an information processor substantially as described and illustrated herein.

A method of operation of a system including a digital computer and an analog computer substantially as described and illustrated herein.

A communication device substantially as described and illustrated herein.

A photon source substantially as described and illustrated herein.

It is emphasized that the invention relates to all combinations of the above features, even if these are recited in different claims.

BRIEF DESCRIPTION OF THE DRAWINGS

The accompanying drawings illustrate non-limiting example embodiments of the invention.

FIG. 4 is table illustrating computational states based on the energy levels shown in FIGS. 3A and 3B.

FIG. 5 includes schematic diagrams illustrating computational states based on the energy levels shown in FIGS. 3A and 3B.

DETAILED DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive sense.

Disclosed herein are systems, devices, articles, and methods with practical application in information processing (e.g., computing, communication, quantum computing, and quantum communication). Information processing includes processing information where information is stored in the physical state of a physical (e.g., tangible) system. Communication includes transferring information from one physical system to another physical system by one or more signals which describe the physical state of a physical system. Quantum information processing includes processing information by using one or more quantum physical effects, such as, superposition, coherence, decoherence, entanglement, nonlocality, and teleportation. Some implementations of the present systems, devices, articles, and methods include, or are characterized by, two or more of the following aspects of a quantum computer: well-defined qubits, reliable state preparation, low decoherence rates, accurate quantum gate operations, multi-qubit operations, and quantum measurements. The systems, devices, articles and methods, with practical application in quantum communication and quantum computing, can interconvert states in stationary qubits (e.g., solid state) and flying qubits (e.g., photons).

Some implementations of the present systems, devices, articles, and methods include, or are characterized by, information being stored in, or manipulated by energy differences, associated with energy states of one or more local luminescent defects (e.g., radiation damage centres) in a body(ies) of semiconductor material, e.g., silicon. Some implementations of the present systems, devices, articles, and methods include, or are characterized by, information being stored in, or manipulated via, an exciton state. Some implementations include one or more bound-exciton defects.

Figure 1:
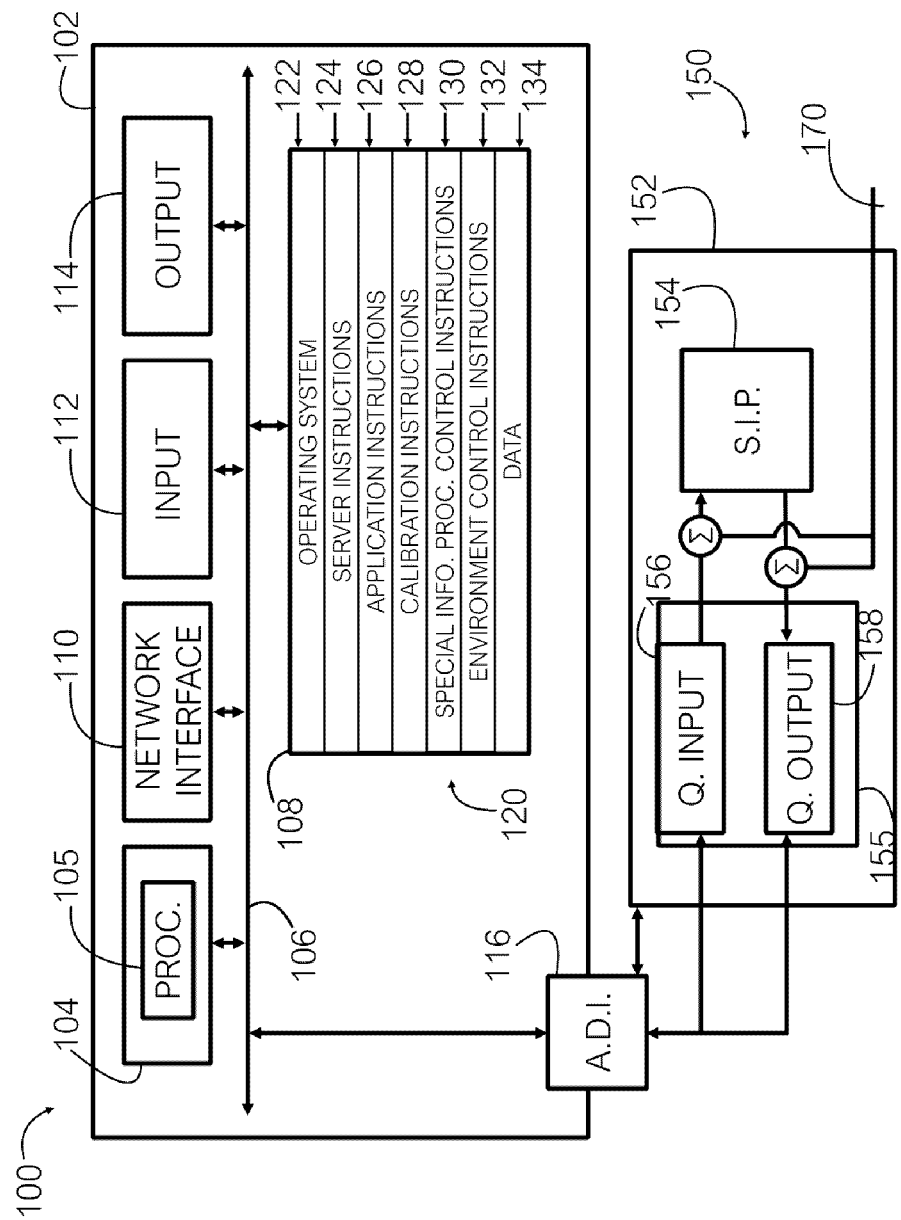
FIG. 1 is a schematic diagram illustrating a portion of a system including a processor-based device communicatively coupled to a special information processor.

FIG. 1 illustrates a processor-based system 100 including one or more specialized devices to process information. System 100 includes a digital computer 102 that comprises a control subsystem 104. Control subsystem 104 includes at least one processor 105. Digital computer 102 includes at least one bus 106 coupled to control subsystem 104. System 100 further includes at least one non-transitory computer- and processor-readable storage device 108, and a network interface subsystem 110, both communicatively coupled to bus(es) 106. Digital computer 102 includes an operator input subsystem 112, and an output subsystem 114, communicatively coupled to the bus(es) 106. Digital computer 102 also includes an analog device interface (ADI) subsystem 116 coupled to bus(es) 106. Bus(es) 106 may communicatively couple two or more subsystems in computer 102. In some implementations, some subsystems of system 100 may be omitted or combined. Some subsystem of system 100 may be remotely accessed via network interface subsystem 110.

The at least one processor 105 may be any logic processing unit, such as one or more digital processors, microprocessors, central processing units (CPUs), graphics processing units (CPUs), application-specific integrated circuits (ASICs), programmable gate arrays (PGAs), programmed logic units (PLUs), digital signal processors (DSPs), network processors (NPs), and the like.

Network interface subsystem 110 includes communication circuitry to support bidirectional communication of processor-readable data, and processor-executable instructions. Network interface subsystem 110 may employ communication protocols (e.g., FTP, HTTPS, SSH, TCP/IP, SOAP plus XML) to exchange processor-readable data, and processor-executable instructions over a network or non-network communication channel (not shown) such as, Internet, a serial connection, a parallel connection, ETHERNET®, wireless connection, fiber optic connection, combinations of the preceding, and the like.

Operator input subsystem 112 includes one or more user interface devices such as keyboard, pointer, number pad, touch screen, or other interface devices for a user or human operator. In some implementations, operator input subsystem 112 includes one or more sensors for digital computer 102 or analog device 150. The one or more sensors provide information characterizing or representing the environment or internal state of digital computer 102 and/or analog device 150. Further, output subsystem 114 includes one or user interface devices such as display, lights, speaker, and printer.

Storage device(s) 108 include at least one nontransitory or tangible storage device. Storage device(s) 108 can, for example, include one or more volatile storage devices, for instance random access memory (RAM); and one or more non-volatile storage devices, for instance read only memory (ROM). The storage device(s) 108 may comprise solid state memory, flash memory, magnetic hard disk, optical disk, solid state disk (SSD), hard disk drive (HDD), network drive, other forms of computer- and processor-readable storage media, or a combination. A person of ordinary skill in the art will appreciate storage device(s) 108 and may be implemented in a variety of ways, such as, non-volatile storage, volatile storage, and/or a combination thereof. Further, computer systems can conflate volatile storage and non-volatile storage, for example, caches, solid-state hard drives, in-memory databases, and the like.

Storage device(s) 108 includes or stores processor-executable instructions and/or processor-readable data 120 associated with the operation of system 100. Executing processor-executable instructions 120, and, optionally, reading processor-readable data 120 causes the at least one processor 105, and/or control subsystem 104, to carry out, or cause, various methods and actions to be performed by system 100, digital computer 102, other systems or devices, or a combination. For example, through network interface subsystem 110, or ADI subsystem 116. Processor-executable instructions and/or processor-readable data 120 can, for example, include a basic input/output system (BIOS) (not shown), an operating system 122, peripheral drivers (not shown), server instructions 124, application instructions 126, calibration instructions 128, special information processor control instructions 130, environment instructions 132, and data 134. A portion of storage device(s) 108, or processor-executable instructions and/or processor-readable data 120 may be included in an articling of manufacture comprising a non-transitory processor readable storage device.

Exemplary operating system 122 includes, for example, LINUX®, and WINDOWS® operating systems. Server instructions 124 include processor-executable instructions and/or processor-readable data to interact with processor-based devices external to system 100 across a network through network interface subsystem 110. In some implementations, processor-executable server instructions 124 include processor-executable instructions and/or processor-readable data that, when executed by a processor, schedules jobs for digital computer 102 or analog device 150. Application instructions 126 include processor-executable instructions that, when executed, cause system 100 to perform one or more actions associated with an application, e.g., perform computations on digital computer 102 or analog device 150.

Calibration instructions 128 include processor-executable instructions, that, when executed by a processor (e.g., processor(s) 105) cause the processor to calibrate and store the calibrated values for analog device 150. Components included in or on analog device 150 could have inter-component variation in operating parameters. Variation in operating parameters may vary with time or vary from expected or ideal component parameters. Calibration instructions 128, when executed by a processor, allow for test and correction of these inter-component variation, temporal variation, and/or variation from expected or ideal component parameters.

Special information processor control instructions 130 include processor-executable instructions that, when executed by a processor (e.g., processor(s) 105), cause the processor to control, initialize, write to, manipulate, read out, and/or otherwise send data to/from analog device 150. Special information processor control instructions 130 implement, in part, the methods described herein (e.g., with reference to FIGS. 10-15) and/or make use of control subsystem included in analog device 150.

Environment instructions 132 include processor-executable instructions and/or processor-readable data, that, when executed by a processor (e.g., processor(s) 105), cause the processor to control and monitor aspects of prescribed and possibly specialized environments for part or all of analog device 150. Examples of environment instructions 132 include instructions which when executed monitor and control temperature and magnetic field affecting special information processor 154. Environment instructions 132 could create a thermal profile (e.g., temperature values for some or all of analog device 150 with temporal or spatial dependencies). Environment instructions 132 implement, in part, the methods described herein, including those in and in relation to FIG. 10.

Data 134 may include processor-readable information or data used, obtained, created, or updated by the operation of system 100. For example, one or more logs from digital computer 102 and analog device 150. Data 134 may include processor-readable data comprising parameters for the operation of system 100. Data 134 may include processor-readable data associated with (e.g., created by, referred to, changed by) a processor executing processor-executable instructions, such as, server instructions 124, application instructions 126, calibration instructions 128, special information processor control instructions 130, and environment instructions 132. Data 134 may include processor-readable data corresponding to energy states (e.g. local degrees of freedom) associated with luminescent defects, or transitions (e.g. energy differences) between such states. Examples of such data are shown herein at, at least, FIG. 8.

Analog device interface (ADI) subsystem 116 includes communication circuitry that supports bidirectional communication between digital computer 102 and analog device 150. In some implementations, the input or output from analog device 150 is digital an intermediate state within analog computer is analog. In some implementations, ADI subsystem 116 interacts with an environment subsystem 152 of analog device 150. In some implementations, ADI subsystem 116 interacts with special information processor 154 through one or more subsystems of analog device 150 (e.g., subsystems 156 and 158). In various implementations, ADI subsystem 116 may include a waveform digitizer (e.g., an ALAZARTECH ATS9440, a 4-channel, 14 bit, 125 MS/s card, or an ALAZARTECH ATS9360, a 1-channel, 12 bit, 1.8 GS/s PCI card, card from Alazar Technologies Inc. of Pointe-Claire, QC, CA), an infrared photon detector (e.g., a SINGLE QUANTUM EOS Multi-channel SNSPD photon detector from Single Quantum, Delft, ZH, NL, or an ID230 NIR photon detector from ID Quantique SA, Carouge, GE, CH). Further detectors are described herein at, at least, FIG. 2.

Analog device 150 includes an environment subsystem 152, which in response to execution of the environment instructions 132, provides a prescribed environment for special information processor 154. Aspects of a prescribed environment may include, for example, one or more of moisture, air pressure, vibration, magnetic field, temperature, and electromagnetic fields. In some implementations, environment subsystem 152 provides a low magnetic field around special information processor 154. In some implementations, environment subsystem 152 provides a time invariant magnetic field around information processor 154. In some implementations, environment subsystem 152 provides a time varying or pulsed magnetic field. In some implementations, environment subsystem 152 maintains the information processor 154 at cryogenic temperatures by one or more refrigeration units, and/or cold sources. For example, information processor 154 may be maintained near 4 K. Other useful temperatures for information processor 154 include temperatures in a range from about 1 mK to about 77 K. In some implementations, environment subsystem 152 maintain processor 154 in a range from about 1.5 K to about 4 K. In some implementations, environment subsystem 152 maintains the environment around information processor 154 at a temperature of about 290 K. In some implementations, environment subsystem 152 includes vibration isolation components, such as dampeners in refrigeration units. In some implementations, environment subsystem 152 provides a low moisture and constant air pressure (e.g., a stable vacuum) environment to special information processor 154.

Special information processor 154 may be a quantum device. Quantum devices are manufactures or structures in which quantum mechanical effects are noticeable and/or dominate. Quantum devices (such as, superconducting circuits and spintronic circuits) include circuits in which current transport is dominated by quantum mechanisms. Superconducting circuits use quantum physics phenomena such as tunneling and flux quantization. Spintronic circuits use the physical property of spin (e.g. electron spin) as a resource to receive, process, store, send, or output information. Quantum devices can be used for measurement instruments, in computing machinery, and the like. Examples of computing machinery include components of classical computers and quantum computers.

Information processor 154 may be a quantum information processor which includes one or more qubits or qudits, collectively qubits. A qubit or quantum bit is a logical building block of a quantum computer comparable to a binary digit in a classical digital computer. A qubit conventionally is a defined physical system having two or more discrete states called computational states. Computational states, examples of which are described herein, are analogous to binary states (i.e., 0 and 1) and may be labeled $|0\rangle$ and $|1\rangle$. In some implementations, these states are the eigenstates of a sigma-Z operator (Pauli matrix operator) for the Hamiltonian of the physical system. Such qubits are said to be in the Z diagonal basis and other bases may be used without loss of generality. A qubit may be in a superposition of states or linear combination, e.g., $\alpha|0\rangle + \beta|1\rangle$. Coefficients $\alpha$ and $\beta$ may be complex numbers and have the sum of their modulus sum to one. One or more logical operations can be performed on one or more qubits. These operations can occur at a prescribed time (e.g., at a specified time) or at a frequency for a prescribed period. In some implementations, information processor 154 includes one of more qudits, generalization of a qubit, including three or more computational states, e.g., $|0\rangle$, $|1\rangle$, $|2\rangle$, and perhaps further states up to the dimensionality of the qudit. In some implementations, information processor 154 includes one of more qutrits, that is, a 3-tuple version of a qubit. A person having ordinary skill in the art will appreciate that qubit may be used as a synecdoche where the species "qubit" stands for the genus "qudit".

In some implementations, information processor 154 includes one or more components, devices, or subsystems to perform one or more types of single qubit operations on one or more qubits. Examples of single qubit operations include the sigma-X or bit flip operation, comparable to a classical NOT gate. A sigma-X operation effects a rotation of a quantum state modelled as a Bloch sphere around the X-axis. When the rotation is $\pi$ radians, state $|0\rangle$ is mapped to $|1\rangle$ and vice versa, i.e., a full bit flip.

Some examples of information processor 154 perform a sigma-Y operation on one or more qubits. The sigma-Y operation has no classical binary counterpart. A sigma-Y operation effects a rotation around the Y-axis of the Bloch sphere. If the rotation is n radians the operation maps state $|0\rangle$ to $i|1\rangle$ and state $|1\rangle$ to $-i|0\rangle$. The sigma-Y operation is sometimes called Pauli-Y operation or gate.

Information processor 154 may perform a sigma-Z, or phase operation on one or more qubits. The sigma-Z operation has no classical counterpart. A sigma-Z operation effects a rotation around the Z-axis of the Bloch sphere. If the rotation is radians the operation maps $|0\rangle$ to $|0\rangle$ and $|1\rangle$ to $-|1\rangle$. The sigma-Z operation is sometimes called a phase-flip operation or gate. Examples of implementations of sigma-X, sigma-Y, and sigma-Z operations are described herein at least with reference to FIG. 13.

In some implementations, information processor 154 includes one or more couplers that can couple qubits. This is a two-qubit operation that may be a selective operation. A two-qubit operation may be performed on a first and a second qubit. An example two-qubit operation is a CNOT gate where two qubits are taken as input and the output state of a first qubit is the NOT of the first qubit's input state conditional on the state of the second qubit's input state. A second example two-qubit operation is a CPHASE gate where two qubits are taken as input and the output state is altered by a phase factor $e^{i\varphi}$ if the two input qubits are in state $|11\rangle$. The three other inputs ($|00\rangle$, $|01\rangle$, and $|10\rangle$) remain unaffected. A third example of a two-qubit operation is an Ising operation, or sigma-Z operation.

In information processor 154, qubits can be communicatively coupled to one another through a number of structures and devices. In some implementations, multi-qubit interactions are mediated, for example, by a single coupler included in information processor 154. In some implementations, the multi-qubit interactions can be obtained by direct resonance coupling of the structures and devices involved without a need for couplers. For example, driving two qubits at or near resonance to effect direct resonance interaction. The information processor 154 may effect multi-qubit interactions by executing processor-executable instructions and in response to the execution bring two or more qubits on, or nearly on resonance with each other, e.g., the two or more qubits are neighbours and interact at the same frequency. In some implementations, multi-qubit interactions are mediated by multiple couplers. The information processor 154 includes as couplers one or more optical structures. The information processor 154 may include as couplers one or more optical resonators, and/or one or more waveguides. Examples of implementations of multi-qubit operations are described herein at least with reference to FIG. 14. In some implementations, information processor 154 includes one or more qubits absent of associate couplers.

Analog device 150 includes a control subsystem 155. The control subsystem may include an input system 156, an output system 158, or both. The special information processor input subsystem 156, in response to processor-executable instructions, writes to information processor 154, or manipulates information stored therein. The input subsystem 156 may be formed on the same substrate as information processor 154, physically coupled to information processor 154, communicatively coupled to information processor 154, or a mix of the preceding. In some implementations, input subsystem 156 includes a digital to analog converter. The input subsystem 156 may include one or more of an optical input subsystem, electric field subsystem, magnetic manipulation subsystem, mechanical subsystem, cryogenic subsystem, associated or included components, and the like. Examples of subsystems are described herein with reference to, at least, FIG. 2.

The input subsystem 156 may encode processor-readable information, including classical and quantum information, and transfer that information to information processor 154. The input subsystem 156 may include a light source to apply narrow or broad spectrum light (e.g., pulsed light) to parts of special information processor 154. In some implementations, input subsystem 156 includes an electromagnet to provide a magnetic field to parts or all of information processor 154. In some implementations, input subsystem 156 includes one or more emitters (e.g., wires, antennae, coils) to selectively provide control pulses for one or more times, durations, and frequencies to information processor 154. Example of a pulse generator is a PSPL10070A™ generator available from Tektronix, Inc. of Beaverton, Oreg., US. In some implementations, the emitters are on information processor 154. In some implementations, the emitters are proximate to information processor 154 and coupled to components or devices on it. Microwave, radio frequency (RF), and/or electromagnetic control pulses may be used. In some implementations, input subsystem 156 in conjunction with control subsystem 104 is used to perform electron paramagnetic resonance (EPR) and/or nuclear magnetic resonance (NMR) on electronic and/or nuclear spins in input subsystem 156. In some implementations, a bulk EPR or NMR cavity surrounds the information processor 154.

In some implementations, input subsystem 156 includes wires electrically (e.g., galvanically) coupled to one or more electrodes, or pairs of electrodes included in information processor 154. In some implementations, input subsystem 156 applies DC and AC currents to electrically bias and control information processor 154 from input subsystem 156. For example, input subsystem 156 may inject or remove carriers (e.g., electrons, and holes) from one or more parts of information processor 154. Or, in some examples, the input subsystem 156 provides static or oscillating electrical or magnetic fields. DC currents and voltages may be provided by low noise power sources such as battery-powered voltage sources. The currents and voltages may be applied through resistive voltage dividers/combiners. AC currents and voltages may be applied to parts of information processor 154 using an arbitrary waveform generator or signal generator, such as, a TELEDYNE LECROY ARB-STUDIO 1104™ waveform generator, available from Teledyne Technologies, Inc. of Thousand Oaks, Calif., US. AC currents and voltages for electron spin resonance (ESR) may be applied to parts of information processor 154 using a signal generator, such as, an KEYSIGHT E8267D™ microwave vector signal generator. NMR control may be used and include creating signals by a vector signal generator, such as, the KEYSIGHT MXG N5182A RF™ vector signal generator. Both signal generators are available from Keysight Technologies of Santa Clara, Calif., US. Lines leading from and/or to information processor 154, including those shown for example in FIG. 1, may include filters, e.g., low pass, band pass, and high pass filters.

Analog device 150, shown in FIG. 1, includes a special information processor output subsystem 158 to, at least, read from information processor 154. The output subsystem 158 may be formed on the same substrate as information processor 154, physically coupled to information processor 154, communicatively coupled to information processor 154, or a mix of the proceeding. In some implementations, output subsystem 158 includes one or more of an analog to digital converter(s), amplifier(s), filter(s), and the like. In some implementations, output subsystem 158 includes an optical readout device or devices. An optical readout device (e.g., a photodetector) detects photons produced by, or in, the information processor 154 or measures the state of an optical structure included on, or in, information processor 154. An optical structure, such as a resonator, supports one or more photonic modes. Examples of optical structures are described herein. In some implementations, optical readout device(s) distinguishes between the presence, and absence, of one or more photons in the optical resonator. In some examples, optical readout device(s) detects a frequency shift for one or more photonic modes of an optical structure. One optical readout device may readout the state of one or more optical resonators. The state of an optical structure can be dependent on the occupation of a particular state of a luminescent defect, such as, a luminescent defect coupled to the optical structure. Examples of luminescent defects are described herein. In some implementations, output subsystem 158 includes one or more photo detector(s) such as a SINGLE QUANTUM EOS Multi-channel SNSPD photon detector from Single Quantum, Delft, NL, or an ID230 NIR photon detector from ID Quantique SA, Carouge, GE, CH.

In some implementations, output subsystem 158 includes one or more photo detector(s) such as APD110C or PDA20CS2 InGaAs Avalanche photodetectors available from Thorlabs Canada ULC, Saint-Laurence, QC, CA; superconducting on chip photon detector described in Akhlaghi et al., 2015 *Nature Communications* 6: 8233; various detectors described in Eisaman, et al., 2011 *Rev. Sci. Instrum.* 82, 071101; or ADN3010-11 detector from Analog Devices, Inc. of Norwood, Mass., US.

In some implementations, digital computer 102 uses output subsystem 158 to perform logical operations on information in information processor 154. For example, output subsystem 158 may be used to perform measurements on quantum states stored in or on information processor 154.

A multi-qubit measurement relates to observation of a collective, group, or aggregate property of a plurality of qubits, e.g., plurality of qubits defined in information processor 154. Processor(s) 105, and/or control subsystem 104 may perform many methods in information processing that include a multi-qubit measurement readout of an aggregate property of the plurality of qubits. These methods include: quantum error correction (e.g., surface codes), quantum phase estimation, multi-qubit operations, and entanglement generation. The aggregate property of the plurality of qubits could include the parity of the qubits. Here even parity includes a balanced state, such as, an equal number of two computational states, and odd parity an unbalanced state, such as, an uneven number. Odd parity often implies an error syndrome akin to classical error detection codes based on repetition of redundant information. As an example, in the Z basis with four qubits the following states are even: $|0000\rangle$, $|0011\rangle$, $|0110\rangle$, or the like. However, in the X basis where $|+\rangle = (|0\rangle + |1\rangle)/\sqrt{2}$ and $|-\rangle = (|0\rangle - |1\rangle)/\sqrt{2}$ the even parity states include $|----\rangle$, $|++--\rangle$, $|-++-\rangle$, or the like. Other parity states can be defined for other bases and/or for other aggregate properties of the plurality of qubits. Examples of parity measurements are described herein with reference to at least FIG. 10 and FIG. 12.

In some implementations, output subsystem 158 performs single shot readout on the state of components in information processor 154. In some implementations, output subsystem 158 performs readout on the state of components in information processor 154 at gigahertz speed.

In some implementations, quantum output subsystem 158 receives (e.g., receives, requests and receives) quantum non-demolition measurement readout results on the state of components in information processor 154. In some implementations, quantum output subsystem 158 performs readout on the state of one or more ancillary photons that have interacted with at least one component in information processor 154.

In some implementations, analog device 150 is communicatively coupled to a communication channel 170, e.g., quantum information channel. The channel 170 can be used to send information (e.g., quantum information, classical information) to and from information processor 154. The channel 170 may communicatively couple information processor 154 and one or more information processors, such as, a second instance of information processor 154. The channel 170 may communicatively couple information processor 154 to another device, such as, photon generator.

In some implementations, portions of digital computer 102 and analog device 150 are omitted to create a smaller information processing device including information processor 154, and channel 170. In some implementations, portions of digital computer 102 or analog device 150 are a communication device.

Figure 2:
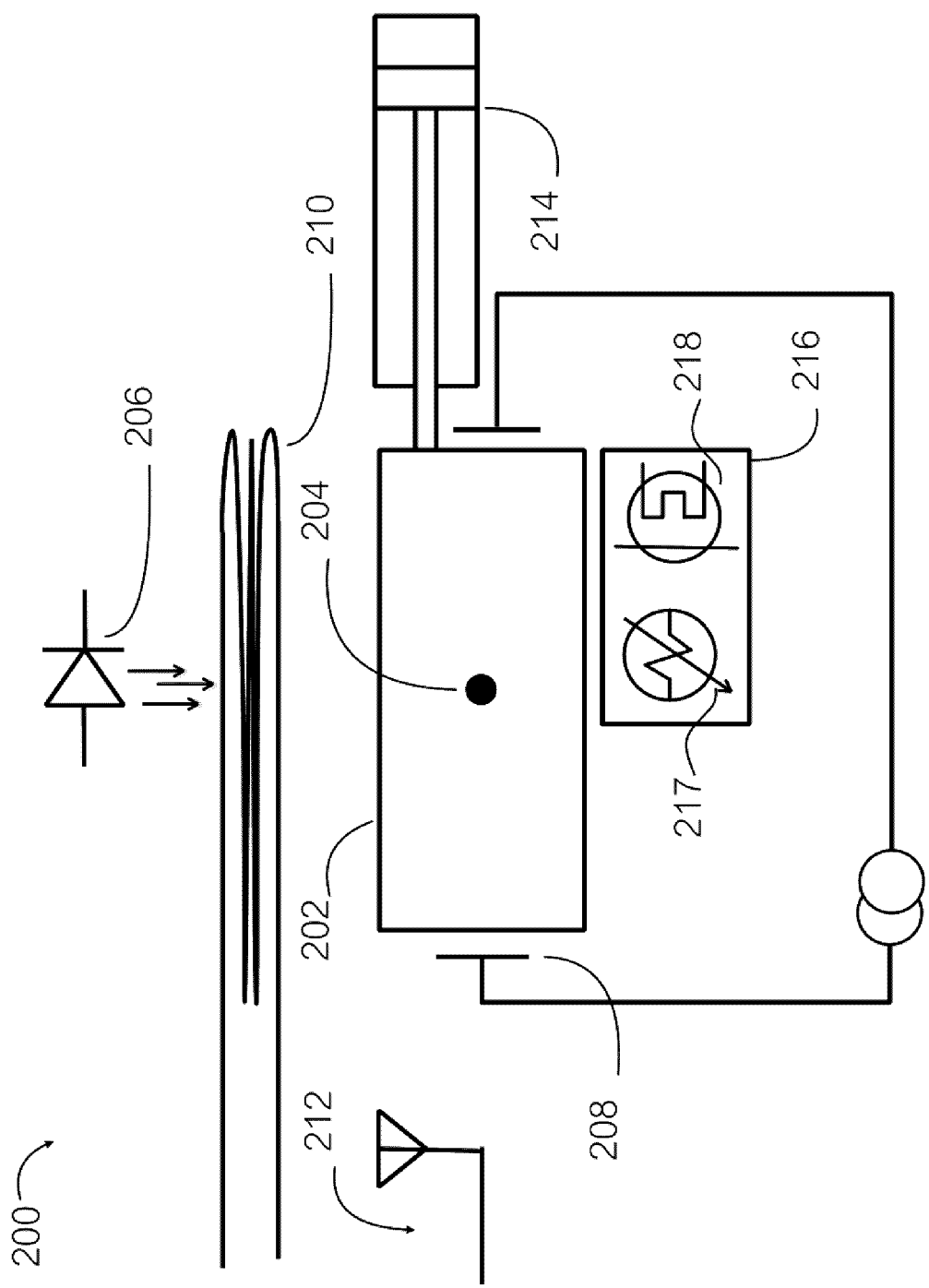
FIG. 2 is a schematic diagram illustrating an example defect and a body of semiconductor material.

FIG. 2 is a schematic diagram illustrating a part of a device 200. The illustrated part of device 200 includes a substrate of semiconductor material, body of semiconductor material, or semiconductor material 202, and an exemplary defect 204 disposed (e.g., created, formed, implanted, located, placed, situated) within the semiconductor material 202. Device 200 may be operated as an information processor, e.g., quantum information processor, optical processor, optical device, and communication device.

In some implementations, semiconductor material 202 includes silicon. Semiconductor material 202 can include natural silicon. Semiconductor material 202 can include other substances like silicon carbide or silicon germanium. In some implementations, semiconductor material 202 includes purified paramagnetic silicon, or a so-called silicon vacuum. One way to increase performance metrics for a physical system (e.g., longer coherence time for a system such as device 200) is to use a semiconductor material processed to remove a large fraction of non-paramagnetic isotopes (e.g., silicon-29) that broaden spectroscopic measurements. Enriched or purified silicon has been processed to remove some to nearly all non-zero-nuclear spin isotopes, such as, silicon-29. Purified silicon includes material enriched various levels of silicon-28, such as, 99%, 99.9%, and 99.99%. Purified silicon includes material enriched with silicon-28. Purified silicon includes silicon where spectroscopic linewidths are at least ten to hundred times sharper than in natural silicon. These defects showed examples of linewidth narrower by a factor of about: 50 (W-centre), and 200 (G-centre) in purified silicon.

A semiconductor body consisting principally of purified silicon can be produced or purchased. Production techniques include using, as an input material, purified silicon compound (e.g., by isotope, by magnetic properties) created by enrichment methods like gas centrifuge (e.g., silicon tetrafluoride), magnetic mass separation, or ion exchange. Purified gaseous silicon compounds may be part of purification or production process. Such compounds include purified silicon tetrafluoride ($SiF_4$), or purified silane ($SiH_4$). Bodies, crystals, substrates, and wafers including purified silicon may be created using, amongst other methods, molecular beam epitaxy (MBE), and chemical vapor deposition (CVD). Available isotopically purified silicon includes removing silicon-29 to levels of tens, hundreds, thousands, or tens of thousands of parts per million. Suitable semiconductor material 202 may be purchased from Isoflex USA, an isotope supply company, of San Francisco, Calif., US.

In some implementations, semiconductor material 202 is an epilayer of isotopically purified silicon, grown on top of a natural silicon wafer. The semiconductor material 202 may be on the order of a micrometer thick while the natural silicon wafer may be up to on the order of a millimeter thick. In some implementations, the semiconductor material 202 is a thin layer of silicon, grown or deposited on top of a body including insulating material such as silicon oxide, sapphire, silicon nitride, and the like. Here silicon can refer to natural silicon, purified silicon, or a silicon alloy such as a silicon-germanium blend, whose constituent components may be isotopically purified.

Defect 204 is disposed within the bulk of semiconductor material 202. The body of semiconductor material 202 is defined by a plurality of interfaces (e.g., faces, side, or edges). Defect 204 is, in some implementations, disposed deep or far within the bulk or mass of semiconductor material 202. In at least one implementation, defect 204 is disposed at a shallow or near interface, e.g., distance equal to or less than 10 nanometers from an interface of the plurality of interfaces. In some implementations, defect 204 is disposed at a distance greater than 10 nanometers from an interface of the plurality of interfaces. In some implementations, defect 204 is evanescently coupled to an optical structure (e.g., resonator, waveguide, lens; not shown in FIG. 2). In some implementations, defect 204 is disposed at a distance greater than 10 nanometers from each interface of the plurality of interfaces. In some implementations, defect 204 is disposed at a distance greater than 30 nanometers from each interface of the plurality of interfaces. In some implementations, defect 204 is disposed at a distance between 30 and 500 nanometers from an interface of the plurality of interfaces. In some implementations, defect 204 is disposed at a distance between 10 nanometers and 2 microns from an interface for semiconductor material 202. Defect 204 may be disposed at a distance between 30 nanometers and 1 micron from each interface. The further defect 204 is into body 202, the further defect 204 is away from charges that may reside on the interfaces of the body of semiconductor material 202. Defect 204, and like pluralities, may be formed out of one or more atoms or atomic vacancies (e.g. omitted silicon atoms), and these atoms locally occupy one or more reproducible specific relative positions to one another and to the lattice of semiconductor material 202. The crystalline pattern of silicon atoms may permit a type of defect, defined by its chemical composition and configuration, to have a number of distinct equivalent orientations relative to the lattice, however these distinct orientations are still attributed to the same defect type. The type of defect and implantation method vary with implementation. Silicon industry standard techniques of ion implantation may be used to controllably implant the constituent components of the luminescent defect 204 into semiconductor material 202. One implanting process is described in U.S. Pat. No. 3,434,894.

In some implementations, device 200 includes a defect 204 disposed within the semiconductor material 202. Defect 204 may be a point, localized, or local defect in semiconductor material 202, e.g., silicon lattice. Local may refer to a defect whose atomic constituents or configuration differs from that of pure semiconductor across distances less than 5, 3, or 2 unit cell lengths, where the lattice constants of an undamaged lattice defines a cell length. For example, at least one interstitial silicon atom and/or at least one vacancy (the absence of a silicon atom) can define a defect. A defect may cause distortions (e.g. strain) in neighbouring cells beyond the size of the defect. A defect may support electronic, hole, and/or exciton wavefunctions which extend beyond the size of the defect as defined by its atomic constituents or configuration.

In some implementations, defect 204 is a substitutional defect, a lattice site in semiconductor material 202 contains a different atom than found in the neighbouring lattice sites. Defect 204 may be a vacancy; an empty lattice site which would be occupied in a crystal. In some implementations, defect 204 is an interstitial defect where an atom occupies a non-lattice site. Defect 204 may be a Frenkel defect where an atom moves into an interstitial site and creates a vacancy. That is, a combination of interstitial and vacancy defects. Here atom includes at least one atom, ion, or molecule but the defect remains local.

Defect 204, or pluralities of the same, may be a damage centre, such as, a radiation damage centre. Defect 204 in semiconductor material 202 may constructed by one of a plurality of methods. One class of methods includes applying radiation to semiconductor material 202. In some implementations, applying an electron beam to semiconductor material 202 creates defect 204. Applying radiation may be followed by annealing the semiconductor material 202 at prescribed temperatures. For example, treating a silicon body with an electron beam and annealing near 100° C. creates a G-centre. Temperatures vary by defect, for example, the process for creating a T-centre may include annealing at 450° C. Defect 204 may be formed from implanting carbon into semiconductor material 202. In some implementations, defect 204 is constructed by implanting electrons, neutrons, protons, or silicon or other atoms into semiconductor material 202 pre-contaminated with carbon. The semiconductor material 202 may be a wafer including silicon. The wafer may be silicon-on-insulator wafer such as a 220 nm thick wafer overlying silicon dioxide insulator. The silicon may be extrinsic silicon doped with substitutional donor or acceptors. The wafer is subjected to beam of carbon ions with beam energy between 5 and 100 keV (e.g., 20 keV, 30 keV, 40 keV). The wafer can be treated with further carbon ions at same or different (e.g., lower energy). Optionally the semiconductor material 202 may be annealed to repair damage during ion implantation. For example, semiconductor material 202 may be heated by furnace, heater, lamp, or laser to high-temperatures (e.g., near or over 1,000° C.) on a timescale of several seconds to a few minutes. The semiconductor material 202 is cooled at a slow rate to prevent effects of thermal shock (e.g., breakage). The Rapid Thermal Anneal (RTA) and Rapid Thermal Processing (RTP) in semiconductor manufacturing are applicable. The semiconductor material 202 can be implanted with protons with a beam at two orders of magnitude higher than carbon ions, e.g., at 2 MeV.

In some implementations, defect 204 is a "luminescent defect" which may also be labelled a "luminescent impurity", "luminescent acceptor", or "luminescent donor" in an appropriate context. Luminescent defects include a pair of energy states where the decay process from the first state of the first pair of energy states to the second state of the first pair of energy states has a sufficient characteristic probability (e.g. 0.1%) of generating at least one optical photon. The characteristic probability of emitting at least one optical photon is the likelihood of optical photon emission from defect 204 when located in the bulk of an unstrained semiconductor body 202. The probability of optical photon emission from defect 204 when not in a bulk-like strain-free semiconductor environment can differ substantially from its characteristic optical photon emission probability through effects such as the Purcell Effect which can influence the local density of states. An optical photon is a photon with wavelength in the ultraviolet (UV), visible (VIS), or infrared (IR) bands, that is, wavelengths between about 10 nm and 100 μm.

A defect can have a plurality of energy states which do not share the same number of electrons, holes, excitons, local vibrational excitations, and the like.

Defect 204 can support a bound-exciton transition, defined by a first pair of energy states where the first state of the first pair of energy states and the second state of the first pair of energy states differ in the number of excitons present in their respective energy states.

Defect 204 have a pair of energy states where the decay process from a first state of the first pair of energy states to a second state of the pair of energy states has sufficient photon generation probability of generating one optical photon and no phonons (e.g. quantized quasiparticles of vibrational energy). The transition energy of the optical photon is called a Zero Phonon Line (ZPL) transition energy.

Defect 204 can be of a type defined by its chemical composition and configuration and/or by physical property like a characteristic optical photon energy such as ZPL transition energy. The characteristic optical photon energies and typical photon generation probabilities of a defect can be modified by constituent atomic isotopes and/or the environment of the luminescent defect including but not limited to temperature, strain, pressure, electromagnetic fields, or the like. To a person skilled in the art it is clear that the characteristic transition energy and/or photon generation probability of a type of luminescent defect modified by the environment and/or isotopic composition of the luminescent defect does not constitute a distinct type of luminescent defect. The optical transition may be affected by a splitting as described herein.

Device 200 can store or manipulate information in one or more exciton states. An exciton is a quasi-particle including an electron and a hole. Energy applied to device 200 elevates the electron to an excited state and is electrostatically attracted to a hole—unfiled vacancy in the semiconductor material 202. The electron and hole pairs may (re)combine to emit a photon. Excitons, at low energy, are attracted to defects like defect 202 and thus may move, or be bound, to defect 202, e.g., localized, at a point. Defect 202 having a bound-exciton can be called a bound-exciton defect. Defect 202 can include a bound-exciton, or display a bound-exciton transition. The states of defect 202 can include a neutral ground state and a charge ground state. For a defect with a bound electron the first excitonic state includes the electron and with the exciton an additional electron and hole. The electrons can pair up. For a defect with a neutral ground state the first excitonic state includes an exciton an electron and hole. Examples of local defects with neutral ground states include C centres and P centres. Herein the case of charged ground state with an extra electron is used as a running example.

Defect 202 when including a luminescent transition and bound-exciton can be called a bound-exciton luminescent defect. From the plurality of energy states possessed by a bound-exciton luminescent defect there exists at least one pair of energy states which are luminescent and at least one pair of states which differ in their number of excitons, and the energy states used to define a luminescent transition and the bound-exciton transition may be partly or completely distinct.

In some implementations, device 200 includes one or more bound-exciton defects. Device 200 stores or manipulates information stored at the bound-exciton defect(s), e.g., defect 204, through an exciton state. In some implementations, a qubit is defined at defect 204 and at least one computational state for the qubit is an exciton state. In some implementations, a qubit defined at defect 204 includes a pair of computational states defining a bound-exciton transition. One or both of the pair of computational states may be an exciton state.

In some implementations, device 200 includes one or more bound-exciton luminescent defects which possess an additional degree of freedom such as an unpaired electron spin, a nonzero nuclear spin, an unpaired hole spin, multiple possible charge states, exciton number, and the like, for at least one of the energy states which constitute part of a bound-exciton and/or luminescent transition. In some implementations, these additional degrees of freedom are used to define the computational states of the at least one qubit. See examples described in reference to, at least, FIG. 4.

Examples of bound-exciton local luminescent defects include so-called C, F, G, I3, P, W, X centres or the like including isovalent or isoelectronic replacements or substitutions. Examples of bound-exciton luminescent centres include so-called T, Ga1, and Al1 centres, or the like. Examples of bound-exciton luminescent centres include so-called I, M, and N-C centres, or the like. Each centre listed can be labeled by a short or long identifier, e.g., "T" or "T-centre".

For greater clarity known aspects of these centres are described before returning to description of uses of bound-excitons at these centres. A C-centre, is thought to comprise carbon and oxygen, is known to have a ZPL luminescence near 1570 nm (0.789 eV, 6364 $cm^{-1}$) in the so called L-band (1565-1625 nm). The L-band is one of five named telecommunication bands covering 1260 nm to 1625 nm where optical fibers have low loss. An F-centre, has a luminescence near 1304 nm (0.9508 eV, 7668 $cm^{-1}$ O-band). A G-centre has a luminescence near 1280 nm (0.969 eV, 7823 $cm^{-1}$, O-band). An I3-centre with ZPL luminescence near 1041 nm (1.041 eV, 8396 $cm^{-1}$) in the near IR. A P-centre has a luminescence near 1616 nm (0.767 eV, 6186 $cm^{-1}$, L-band). A W-centre has characteristic emissions near 1218 nm (1.018 eV, 8210 $cm^{-1}$, near IR). The X-centre has a characteristic ZPL transition near 1088 nm (1.14 eV, 9195 $cm^{-1}$).

A T centre is thought to include two carbon atoms and one hydrogen atom and has a characteristic ZPL optical transition energy near 935.1 meV (7542.0 $cm^{-1}$, 1326 nm, O-band). The Ga1 defect has a luminescence near 1416 nm (875 meV, 7057.4 $cm^{-1}$, E-band). The Al1 (aluminum one) defect has a luminescence near 1483 nm (836 meV, 6742.8 $cm^{-1}$, S-band) are thought to have chemical composition and configurations similar to T-centre but are characterized by their stated properties.

An I-centre has ZPL transition near 1285 nm (0.965 eV, 7783 $cm^{-1}$, O-band). An M-Centre comprises a local defect in the silicon lattice (761 meV, near IR). The five N-C centres (also known as lines N1, N2, N3, N4, N5) have characteristic ZPL transition energies near 746 meV and each are thought to have distinct chemical and/or structural configurations. Further examples of defects with optical transitions are included in Gordon Davies, 1989 *Physics Reports* 176: 83-188.

Species and genera of defects described herein have one or more equivalents known to a person of skill the art. These equivalents include isovalent or isoelectronic replacements or substitutions for one or more atoms includes in the defects. Isoelectronic substitutions have the same number of valence electrons and include elements in the same period, e.g., germanium may replace carbon in a defect, or lithium may replace hydrogen. Isoelectronic substitutions include charged atoms from adjacent periods. The isoelectronic substitutions affect the mechanical and electronic structure of a defect and substitutions may be used to vary the vibrational or optical interactions with the defect. The optical transition may be affected by a splitting as described herein.

In some implementations, device 200 includes acceptor defects or acceptor sites within semiconductor material 202 to receive electrons. One suitable defect for an acceptor site is boron. An acceptor could include an acceptor from Group III (13), e.g., boron, aluminum, gallium, and indium. In some implementations, device 200 includes donor defect sites within the silicon material to donate electrons. One suitable defect for a donor site is phosphorus. A donor could include a donor from Group V (15), e.g., phosphorus, arsenic, bismuth and antimony.

Device 200 may include an optical structure (not shown). The optical structure can include a resonator, optical resonator, waveguide, optical coupler, optical cavity, cavity, and other arrangements of refractive and reflecting material. In some implementations, defect 204 is evanescently coupled to one or more optical structures.

Device 200 may include an optical input subsystem comprising one or more optical components, such as, a light source 206. The optical component(s) are operable, e.g., act in response to execution of processor-executable instructions, to selectively apply light to defect 204. Light source 206 may apply light in a pulsed way. Optical components may apply light at, at least, a first frequency to defect 204. The first frequency corresponds (e.g., near, at) to an energy difference between the pair of computational states of defect 204. Light source 206 may be communicatively coupled to the processor(s) 105 in system 100 and operate in response to processor(s) 105 executing processor-executable instructions. The optical input component(s) (e.g., light source 206) may be disposed in, on, near, or distant (to) semiconductor material 202. The relative locations and orientations of the components shown in FIG. 2 have largely been chosen for illustrative purposes, for example, light from light source 206 need not be collinear with the magnetic field and perpendicular to the electric field and the like.

Device 200 may include one or more electric field subsystems including electrical components, such as, electrodes 208. The electric field subsystem(s) can, e.g., act in response to execution of processor-executable instructions, apply an electric field of, at least, a first strength to semiconductor material 202 or defect 204. The electric field may include a gradient. That is the electric field subsystem(s) are operable to selectively vary an electric field incident on semiconductor 202. The electric field subsystem(s) effect changes in the energy eigenstates of defect 204. The electric field subsystem(s) may power components on or near semiconductor material 202. The electric field subsystem(s) may apply pulsed electrical manipulation of defect 204.

Device 200 may include one or more magnetic manipulation subsystems comprising one or more magnetic input components, such as, coil 210. The magnetic manipulation subsystem(s) can effect changes in the energy eigenstates of defect 204. The magnetic input component(s) are operable to selectively apply a magnetic field to semiconductor material 202 and/or defect 204 disposed within semiconductor material 202. The magnetic field may be oriented with respect to a lattice direction in semiconductor material 202 or a plurality of defects like defect 204. The magnetic field may be static or varying with respect to time or location in semiconductor material 202. In some implementations, magnetic input component(s) include a wide bore superconducting magnet. Processor(s) 105 in system 100 may, in response to executing processor-executable instructions, direct coil 210 to apply a magnetic field to semiconductor material 202.

A magnetic manipulation subsystem(s) included in device 200 may include at least one radio frequency input component, such as antenna 212, a pair of antennae, etc., selectively operable to apply radio frequency pulses to semiconductor material 202 and/or the defect 204. Processor 105 may direct magnetic manipulation subsystem(s) (e.g., direct coil 210 and antenna 212) to flip an electronic or a nuclear spin associated with the defect 204. Processor(s) 105 in system 100 may direct the magnetic input components and the radio frequency input component to perform magnetic resonance control, e.g., NMR and ESR, of defect 204 or a plurality of defects. For example, coil 210 may apply a field of strength $B_0$ to defect 204 and antenna 212 a radio frequency pulse at frequency that is proportional to the product of field of strength $B_0$ and the gyromagnetic ratio $\gamma$ for the spin and adjusted for additional interaction(s) of the spin in device 200.

Device 200 may include a mechanical subsystem comprising one or more mechanical input components. An example of a mechanical input component is an actuator 214. Actuator 214 may be paired with a rest or support (not shown) disposed on an opposing side of semiconductor material 202. The mechanical input component(s) may be operable, e.g., in response to executing processor-executable instructions, to selectively vary (e.g., apply, remove) a strain in at least one direction to semiconductor material 202. Thus, the mechanical subsystem can through the strain in semiconductor material 202 effect changes in the energy eigenstates of the defect 204. The mechanical input device(s) can impart strain locally within or across semiconductor material 202. The mechanical input component(s) may be disposed in semiconductor material 202 or be physically coupled to the exterior of semiconductor material 202. The mechanical subsystem may include one or more Micro-Electro-Mechanical Systems (MEMS) components that in response to execution of processor-executable instructions vary the strain in semiconductor material 202. The MEMS may be powered by the electric field subsystem(s). The mechanical subsystem may include one or more piezo-electric components.

Device 200 may include one or more cryogenic subsystems, such as, cryogenic subsystem 216. Cryogenic subsystem 216 is selectively operable to vary a thermal profile (e.g., temperature, temperature gradient, temperature with spatial or temporal variation) of semiconductor material 202 and effect changes in the energy eigenstates of defect 204. Cryogenic subsystem 216 may include one or both of a heater 217 or a cooler 218. Cryogenic subsystem 216 may be operable, e.g., in response to executing processor-executable instructions, to selectively warm, cool, or create a thermal gradient in semiconductor material 202.

In various implementations, examples of device 200 operate as information processor with one or more input subsystem or devices are communicatively coupled to semiconductor material 202 or defect 204. The one or more input subsystem or devices may be physically coupled to semiconductor material 202. For example, a quantum input subsystem overlies the semiconductor material 202, is disposed near the semiconductor material 202, or is disposed within the semiconductor material 202. The optical input component(s), the electrical input component(s), the magnetic input component(s), and the like may overlie (which includes underlies) a part of semiconductor material 202, or may be structures defined in semiconductor material 202. One or more output subsystem or readout devices are communicatively and/or physically coupled to semiconductor material 202 or defect 204. For example, a photon detector may be positioned like light source 206. Further examples of read out devices and detectors are described herein, at least, in relation to FIGS. 1, and 7. Or see, at least, FIG. 6 of co-pending US Patent Application entitled "Systems, Devices, Articles, and Methods to Interact with Information Stored in Orbital States Associated with Silicon Defects".

Figure 3A:
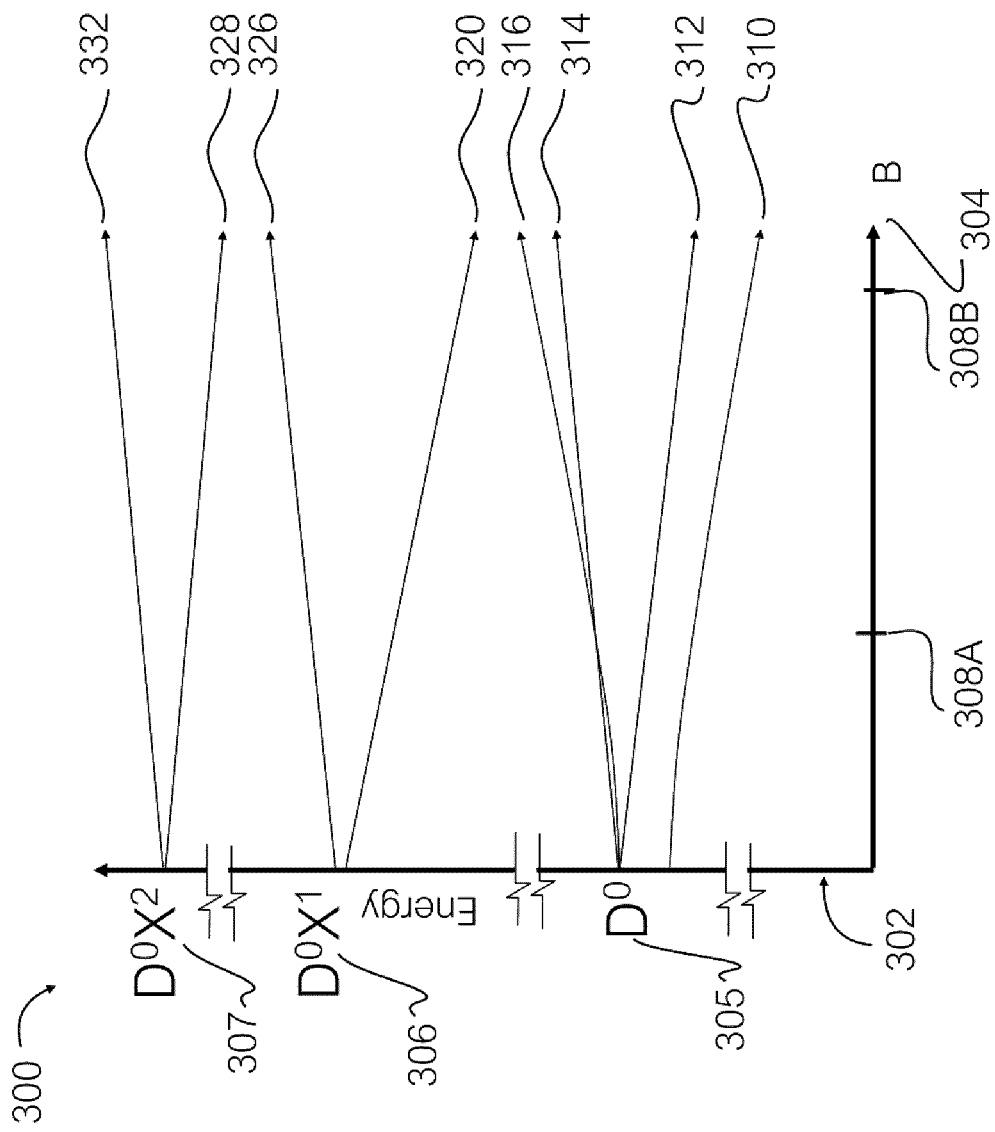
FIG. 3A is a graph illustrating energy levels plotted against magnetic field for ground, excited, and exciton states associated with the example defect shown in FIG. 2.

FIG. 3A includes a graph 300 illustrating energy levels plotted against magnetic field strength. Each level is associated with one or more states of defect 204. Graph 300 includes an energy axis 302 and a magnetic field axis 304. Graph 300 illustrates change in energy for a plurality of energy eigenstates (that is, allowed steady-states) by change in magnetic field. Included in FIG. 3A are pluralities of energy levels 305, 306, and 307. A first plurality of levels 305 are for lower lying states (e.g., ground state) of defect 204, marked D0, such as, T-centre in purified silicon. In some defects the ground state is degenerate. In some defects the lower lying first plurality of levels 305 are split at zero field. A second plurality of levels 306 are for states of a first bound exciton of the defect, labeled D0X1. Plurality of levels 306 are disposed above the first plurality of levels 305. The bound exciton X1 includes two electrons (e.g., paired in a spin singlet) and one hole. A third plurality of levels 307 are energy levels of a second bound exciton, D0X2, of the defect 204 in addition to the first bound exciton. For the third plurality of levels 307 for the multi-excitonic state shown there are three electrons and two holes. With pairing of two holes and two of three electrons the states of the third plurality of levels 307 could be determined by the exciton number and the spin of electron.

The first plurality of levels 305 may have a hyperfine structure. For example, the lowest level may be a singlet state and the next higher levels for triplet states. For some defect the singlet state may have an energy level above the triplet states. Under an applied magnetic field, shown on axis 304, the lower lying first plurality of levels 305 split into a plurality of levels 310, 312, 314, and 316. The levels 310, 312, 314, and 316 are characterized by spin-spin interaction at low field and interaction with the applied magnetic field at high field. At field strength 308A (e.g., 30 mT) two triplet state energy levels (i.e., 314 and 316) cross. At, at least, field strength 308B, greater than 308A, the plurality of levels 310, 312, 314, and 316 are identified by electron spin and nuclear spin. See FIG. 3B.

Under the applied field, indicated on axis 304, the second plurality of levels 306 of the first bound exciton X1 split into at least a pair of levels corresponding to at least two states. For example, levels 306 split according to the spin of a hole into level 320 and level 326. Under the applied field levels 307 of the second bound exciton X2 split into at least a pair of levels, e.g., level 328 and level 332. For example, levels of the second exciton split due to differences in energy for the interaction of a hole included in the second exciton with the applied magnetic field.

Figure 3B:
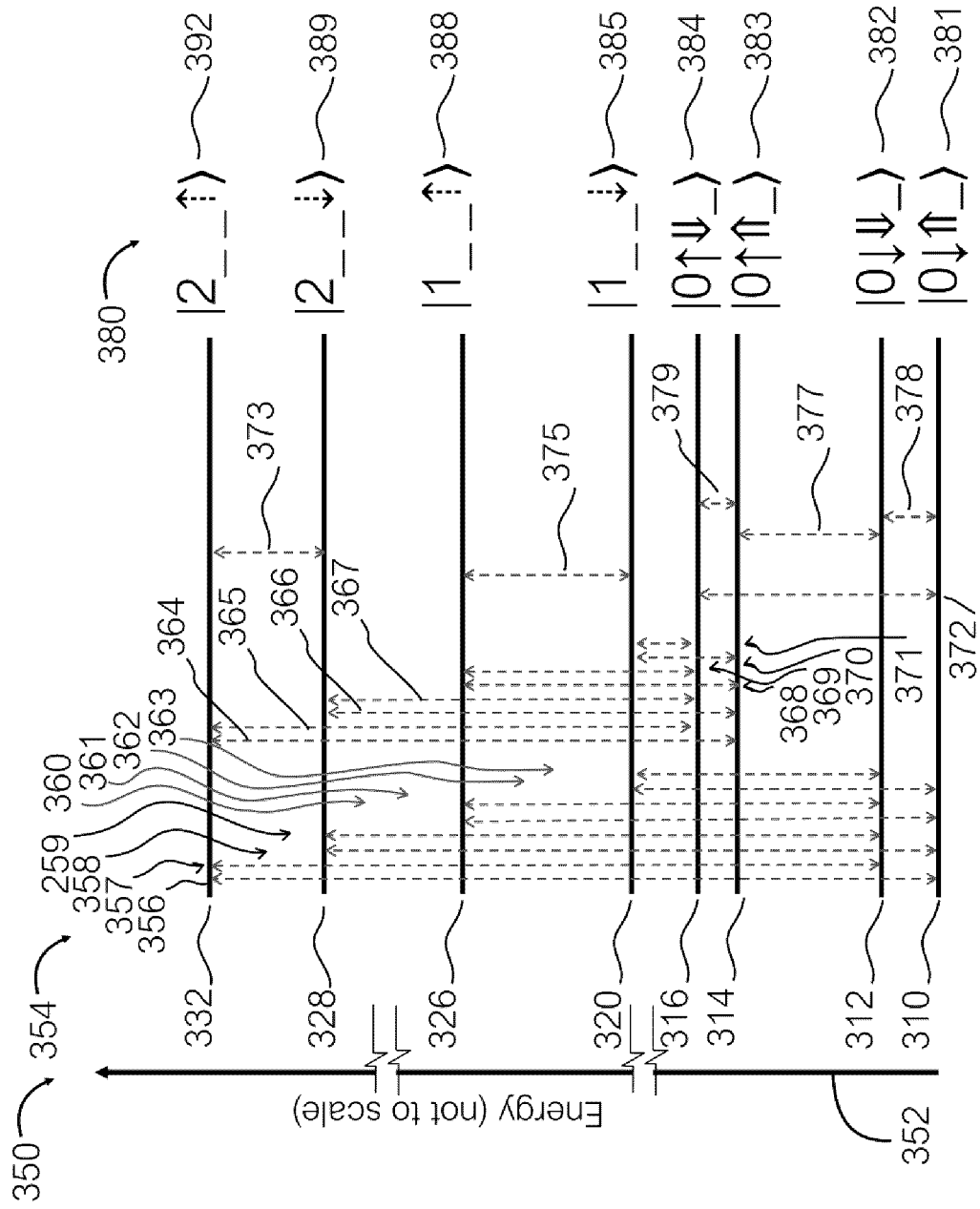
FIG. 3B is a schematic diagram illustrating energy levels, configurations, and transitions associated with the defect shown in FIG. 2.

At a field strength at least equal to field strength 308B a plurality of levels including levels 310, 312, 314, 316, 320, 326, 328, and 332 are identified by exciton number, plus spin of electron, hole, and nuclear spin. See FIG. 3B. In some implementations field strength 308B is greater than 308A. Some transitions are allowed and some forbidden. Some transitions are shown in FIG. 3B. Similar graphs exist showing how a plurality of levels, such as levels 310, 312, 314, and so on, vary with other physical conditions like changes in electric field, temperature, light, and strain on semiconductor material 202 for a chosen defect orientation.

FIG. 3B is a diagram schematically illustrating an exemplary plurality of energy levels, energy eigenstates, or eigenstates 350 associated with a defect 204. Defect 204 may be a bound-exciton luminescent defect, such as, a T-centre.

Different defects will have different energy levels and different labels for energy eigenstates 350. Eigenstates 350 are plotted against an energy axis 352 (not to scale). The plurality of eigenstates 350 includes levels 310, 312, 314, 316, 320, 326, 328, and 332 at high field values. It is possible to refer to levels 310, 312, 314, 316, 320, 326, 328, and 332 as eigenstates.

FIG. 3B includes a plurality of transitions 354 amongst the plurality of 350. Various transitions, e.g., energy differences, are illustrated but any two eigenstates of the plurality of eigenstates may support a transition subject to selection rules, e.g., the transition moment integral of one pair of eigenstates may differ substantially from the transition moment integral of another pair of eigenstates.

The plurality of transitions 354 are generally ordered in decreasing energy from left to right. Transitions 356, 357, 358, and 359 are defined in part by an energy level for a second exciton at defect 204 (levels 307). For example, transition 356 is between low lying level 310 and exciton level 332. Transition 357 separates level 312, itself above level 310, and exciton level 332. Transition 358 separates level 310 and exciton level 328 while transitions 359 separates level 312 and exciton level 328. Transitions 360, 361, 362, and 363 are defined in part by an energy level included in the second plurality of levels 306 for a first exciton at defect 204. Transitions 360, 361, 362, and 363 are defined in part by low lying energy levels (levels 305) for defect 204, such as, level 310 and level 312. Transitions 364, 365, 366, and 367 are defined in part by an energy level for a second exciton at defect 204. That is, energy level in levels 307. Transitions 364, 365, 366, and 367 are defined in part by a low-lying energy level for defect 204, such as, level 314 or level 316.

Transitions 368, 369, 370, and 371 are defined in part by an energy level for a first exciton at defect 204. That is, an energy level in second plurality of levels 306. Transitions 368, 369, 370, and 371 are defined in part by a low-lying energy level for defect 204, such as, level 314 or level 316.

Transitions 372, 373, 375, 377, and 378 are transitions between states having the same exciton number. For example, transition 372 is between level 310 and level 316 where the exciton number is zero. Transition 373 is between two states where the exciton number is two. Transition 375 is between two states where the exciton number is one. Transition 377, transition 378, and transition 379 are between pairs of states where the exciton number is zero.

FIG. 3B illustrates, in schematic form, an exemplary plurality of configurations 380 associated with plurality of eigenstates 350. The plurality of configurations 380 describe the plurality of eigenstates 350 which may be used as computational states. A configuration in plurality of configurations 380 shows quantum states for one or more particles associated with defect 204. As shown in FIG. 3B the configurations are denoted in a ket and, unless otherwise stated, indexed by exciton number, electron spin, nuclear spin, and hole spin. So, a state $|\_,\_,\_,\_\rangle$ has indices benh for bound exciton number, electron, nuclear, and hole spin. The underscore represents an unspecified state. A state of a particle can be denoted with particular symbols. For example, Arabic numeral for exciton number, either $\downarrow$ or $\uparrow$ for electron spin, nuclear spin with double arrow like $\Uparrow$ for spin up, and hole spin shown by stippled arrow like $\uparrow$. Since a hole can have one of four spin value $-3/2$, $-1/2$, $1/2$, and $3/2$, an arrow in one direction represents two spin states of the same sign, and a spin value for the hole expresses state with further specificity.

In some implementations the plurality of configurations 380 include bound exciton spin states. For example, one bound exciton state is modified by the spin of an unpaired electron. Alternatively or additionally the bound exciton state is split by the spin of a hole or a nuclear spin.

Configuration 381 includes exciton number zero, electron spin down, and an anti-aligned nuclear spin. With no exciton there is no hole, so the final state is blank. Configuration 382 includes states $|0\downarrow\Downarrow\_\rangle$ where the nuclear and electronic spins are aligned. Configuration 383 has aligned electron and same nuclear spin like configuration 382 but in the opposite direction. Configuration 384 includes opposite electron and nuclear spins to each other and as in configuration 381. In some implementations, a T-centre at about 80 mT in configuration 384 is separated from configuration 381 by transition 372 with energy difference about 800 MHz. In the same conditions transition 379 with energy difference about 1 MHz lies between configuration 384 and configuration 383. In the same conditions, configuration 381 is separated from configuration 382 by transition 378 with energy difference about 4 MHz.

For the configurations including an exciton the electron at the defect 204 is bound to another electron so the state of the electron carries no information. The state of the hole included in the exciton and optionally the nuclear spin set the configurations. Configuration 385 includes exciton number one, and hole spin down $\downarrow$. Configuration 388 includes exciton number one, and hole spin up $\uparrow$. Configuration 389 includes exciton number two, and hole spin down $\downarrow$. Configuration 392 includes exciton number two, and hole spin up $\uparrow$.

FIG. 4 includes a table 400 illustrating a plurality of computational states based on eigenstates 350 shown in FIG. 3B. Included in table 400 are a plurality of pairs of computational states where each respective pair includes a first ($|0\rangle$) and a second ($|1\rangle$) computational states. The computational states vary with implementations and a pair of computational states is termed a code. In some implementations, at least one state of the first computational state ($|0\rangle$) and the second computational state ($|1\rangle$) have at least one bound-exciton associated with defect 204, e.g., a non-zero number of bound-excitons localized on the defect 204. In some implementations, the first and second computational states differ in their bound-exciton configuration, e.g., number of bound-excitons localized on defect 204. In some implementations, the first and second computational states differ in configuration of a particle associated with defect 204.

In some implementations, a pair of computational states includes an electron spin for one bound-exciton configuration for the defect 204, and a hole spin for a second bound-exciton configuration. In some implementations, a first computational state includes a first non-zero exciton number and a second computational state includes a second non-zero exciton number. The first and second exciton numbers are non-zero, and differ by one or more. In some implementations, a first computational state includes a first exciton number and a second computational state includes a second exciton number. The first and second exciton numbers are counting number and differ by one or more.

In some implementations, a pair of computational states differ by exciton number for defect 204. For instance, Code 1 includes $|0\rangle=|0,\downarrow,\_,\_\rangle$ and $|1\rangle=|1,\_,\_,\downarrow\rangle$, where the indices are in order for bound-exciton number, electron spin, nuclear spin and hole spin, and underscore is an unspecified value, e.g., wildcard, not relevant. Examples of computational states in Code 1 include configuration 381 or configuration 382, and 385 differing by transitions 362 or 363. Further examples of computational states differ by exciton number for defect 204 include, for example, $|0\rangle = |x,\_,\_,\_\rangle$ and $|1\rangle = |x+1,\_,\_,\_\rangle$), where x is the exciton number, and $|0\rangle = |x,\_,\_,\_\rangle$ and $|1\rangle = |x+2,\_,\_,\_\rangle$.

In some implementations, the computational states include a spin state. A pair of computational states can differ by a spin state. For example, a pair of states differ by the value of a nuclear spin at defect 204. For example, Code 2 includes $|0\rangle = |0\downarrow\Uparrow\_\rangle$ and $|1\rangle = |0\downarrow\Downarrow\_\rangle$ differing by nuclear spin. In some implementations, a pair of computational states following Code 2 are configurations 381 and 382 separated by transition 378.

In some implementations, a pair of computational states include, and differ by, a spin of an electron for defect 204. An example code is Code 3 $|0\rangle = |x,\downarrow,\_\rangle_{ben}$ and $|1\rangle = |x+1,\uparrow,\_\rangle_{ben}$. The transition between a pair of computational states following Code 3 includes a change in electron spin like Code 2, and a change in exciton number like Code 1.

In some implementations, a pair of computational states differ by the spin of a hole at defect 204. The hole is part of an exciton and the pair of computational states both have an exciton. For instance, in Code 4 a first computational state includes a hole with spin down and a second includes the hole with spin up. For a first bound exciton this is $|0\rangle = |1,\_,\_,\Downarrow\rangle$ and $|1\rangle = |1,\_,\_,\Uparrow\rangle$. Code 4 could be implemented with configuration 385 and configuration 388 differing by transition 375. In some implementations, the electron in the bound exciton and the electron at the defect pair up leaving the spin of the hole as the configuration element defining the difference between computational states.

In some implementations, a pair of computational states differ by a spin flip even if the spin is attached to a different particle. For example, defect 204 with one bound exciton includes a spin hole spin included in one computational state and the second computational state includes a flipped spin for an electron. For example, Code 5 includes $|0\rangle = |0,\downarrow,\_,\_\rangle$ and $|1\rangle = |1,\_,\_,\Uparrow\rangle$. The first computational state differs from the second computational state by spin of electron and a hole, respectively.

In some implementations, a pair of computational states share the same spin over two different particles. For example, Code 6 includes $|0\rangle = |0,\downarrow,\Uparrow,\_\rangle$ and $|1\rangle = |1,\_,\_,\Downarrow\rangle$. Code 6 could be implemented by configurations 381 and 385. Associated transition 363 is spin preserving and is brighter in spectroscopic measurements.

In some implementations, a pair of computational states include, and differ by, exciton number for defect 204. An example code is Code 7 $|0\rangle = |x\_\_\_\rangle$ and $|1\rangle = |x+1\_\_\_\rangle$. The transition between a pair of computational states following Code 7 includes a change in creating an exciton from the ground state, relaxing from an exciton state to a lower lying state. Code 7 could include computational states where a nuclear spin is part of the one or both computational stats. For example, a pair of computational states differing by exciton number and nuclear spin, such as, $|0\rangle = |x\_\Uparrow\_\rangle$ and $|1\rangle = |x+1\_\downarrow\_\rangle$. Code 7 may be used in to process classical information encoded in photon states.

In some implementations, the computational states include electron spin and nuclear spin for the defect 204 where the computational states differ by none, one, or both of the electron spin and nuclear spin. In some implementations, the up/down spin labelling convention corresponds to two arbitrary spin eigenstates, and not necessarily defined with respect to the alignment of the background magnetic field. In some implementations, the nuclear spin is 3/2, 5/2 or higher, and the up/down labelling is taken to represent two of the many available nuclear spin eigenstates. In some implementations, the charge state of the defect possesses multiple electrons, and the up/down labelling is taken to represent two of the many available electron spin eigenstates.

In some implementations, the defect 204 is associated with (e.g., supports, has defined for it) computational states including another degree of freedom. For example, a local degree of freedom at defect 204, such as, from further particle such as an electron, hole, or nuclear spin, or a splitting from the effect of strain, orbital states, or valley states.

In some implementations, the defect 204 is associated with a pair of computational states differing in exciton number and the first computational state is associated with a first particle and the second computational state is associated with a second particle. For example, the second computational state may be a hole excited state, singlet excited state, or a triplet excited state.

FIG. 5A and FIG. 5B are schematic diagrams illustrating computational spaces based on eigenstates 350 shown in FIG. 3B and discussed in FIG. 4. FIG. 5A includes a computational space 500 plotted against first axis 502 and a second axis 504. First axis 502 includes a first and a second position for nuclear spin values. Second axis 504 includes a first and a second position for spin values for electron at defect 204.

Computational space 500 schematically illustrates a first pair of computational states and a second pair of computational states at defect 204. Space 500 includes a first pair of computational states comprising a first computational state 506 and second computational state 508. For this pair, the first computational state 506 can be implemented with configuration 381, $|0\downarrow\Uparrow\_\rangle$, the second computational state can be implemented with configuration 384, $|0\uparrow\Downarrow\_\rangle$, and a transition 510 between the first computational state 506 and the second computational state 508 could occur via transition 372.

Computational space 500 schematically illustrates a second pair of computational states for defect 204. The second pair of computational states comprises a first computational state 516 and second computational state 518. The first computational state 516 can be implemented with configuration 382, $|0\downarrow\Downarrow\_\rangle$, the second computational state can be implemented with configuration 383, $|0\uparrow\Uparrow\_\rangle$, and a transition 520 between the first computational state 516 and the second computational state 518 could occur via transition 377.

FIG. 5B includes computational space 550 plotted against first axis 552 and a second axis 552. First axis 552 includes a first, a second, and a third position for down, unknown, and up spin values for an electron at defect 204. Second axis 554 includes a first and a second position for exciton numbers at defect 204.

Computational space 550 includes a triple of computational states for defect 204. The triple of computational states includes a first computational state 556 and a second computational state 558. The first computational state 556 and the second computational state 558 are separated by a direct transition 564. The state of defect 204 can be manipulated from the first computational state 556 and the second computational state 558 via an indirect transition. For example, the defect may be elevated to a third computational state 557, an exciton state, via transition 562. Defect 204 may transition, by transition 563 to the second computational state 558.

Figure 6:
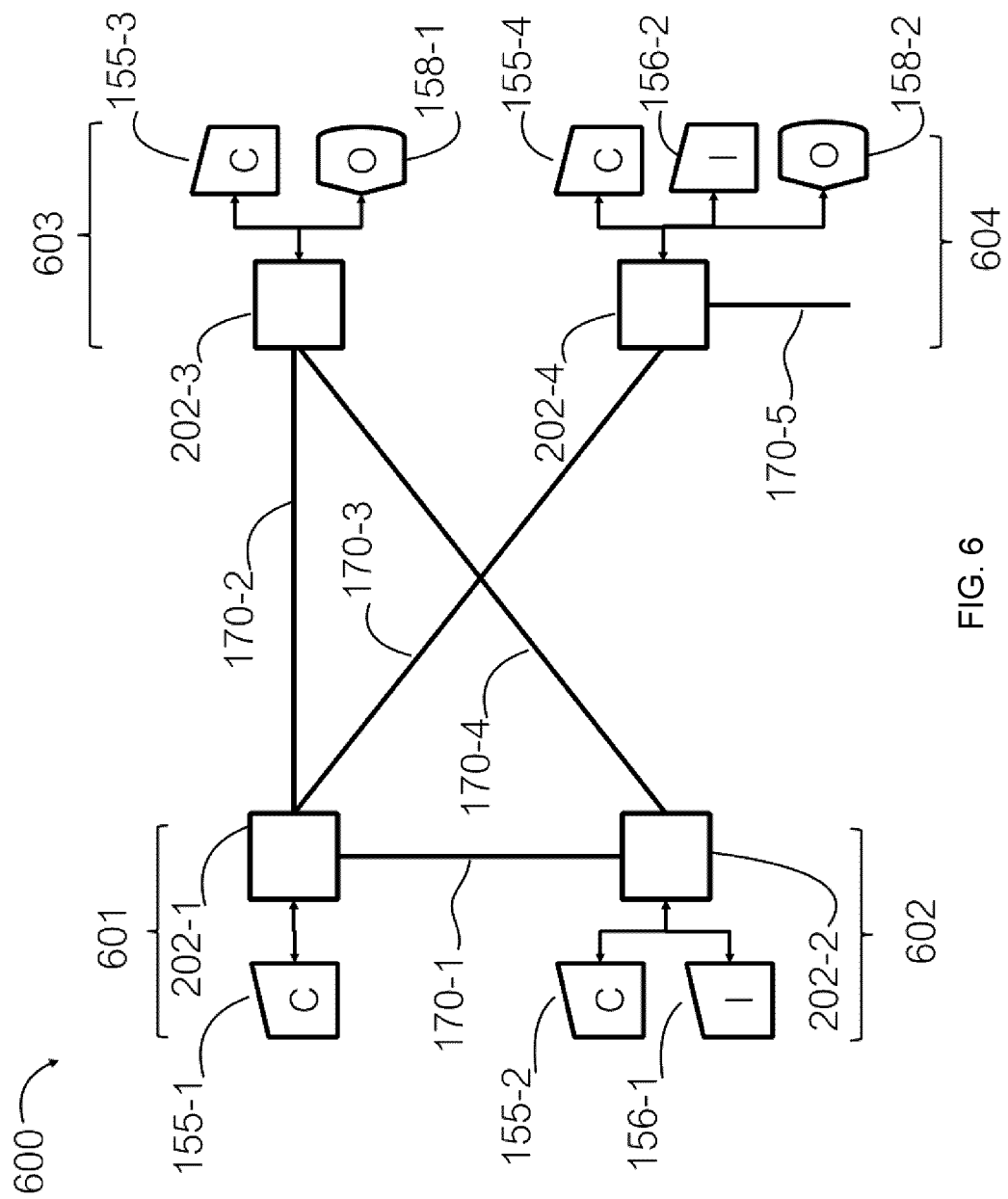
FIG. 6 is a block diagram schematically illustrating an example of a distributed system including one or more device each including a semiconductor body and one or more defects disposed therein like as shown in shown in FIG. 2.

FIG. 6 is a block diagram schematically illustrating an example of a distributed system 600 including one or more device(s) each including a semiconductor body including one or more defects disposed therein. System 600, as illustrated, includes a photon source 601, a transmitter 602, a receiver 603, and a processor 604. System 600, as illustrated, includes a plurality of communication channels 170-1, 170-2, 170-3, 170-4, and 170-5 (collectively channels 170 or individually channel 170). Each of channels 170 can pass information (e.g., quantum information, classical information) to and from photon source 601, transmitter 602, receiver 603, and processor 604.

The photon source 601 includes semiconductor body 202-1 and a control system 155-1 communicatively coupled to the at least one defect disposed in semiconductor body 202-1 (not shown). Control system 155-1, includes circuitry, and in response to processor-executable instructions, manipulates the one or more defects (not shown). Control system 155 may place a defect into a fiducial state, e.g., raise to an exciton state. Upon decay the defect 204 releases a photon and with some spatial modes the photon enters a channel like channel 170-1 or 170-2. Control system 155-1 may operate to emit a plurality of photons over time of photons from photon source 601.

The transmitter 602 includes semiconductor body 202-2 and a control system 155-2 communicatively coupled to the at least one defect (e.g., local luminescent defect) disposed in semiconductor body 202-2. Transmitter 602 also includes input sub-system 156-1. The input sub-system 156-1, includes circuitry, and in response to processor-executable instructions, manipulates information stored in the one or more defects. For example, input sub-system 156 manipulates a representative defect included in the at least one defect disposed in semiconductor body 202-2 into a combination of a first computational state and a second computational state. Transmitter 602 may emit photons into a communication channel like channel 170-1 or channel 170-4. The transmitter 602 differs from photon source 601 in that the information in the photons emitted by the transmitter 602 may be different from each other. The transmitter 602 may send information to receiver 603.

The receiver 603, communicatively coupled to communication channels 170-2 and 170-4, includes semiconductor body 202-3 and a control system 155-3 communicatively coupled to the at least one defect (e.g., damage centre) disposed in semiconductor body 202-3 (not shown). Receiver 603 includes output sub-system 158-1 which comprises circuitry, and in response to processor-executable instructions, measures the state of the one or more defects. Examples of measurement operations are described in relation to, at least, FIGS. 6 and 11.

The processor 604 includes semiconductor body 202-4 and a control system 155-4, input subsystem 156-2, and output sub-system 158-2, each communicatively coupled to the at least one defect disposed in semiconductor body 202-4 (not shown). Processor 604 may act as a photon source, transmitter, receiver, or information processor. The processor 604 may be communicatively coupled to communication channel 170-3, and optionally channel 170-5.

Figure 7:
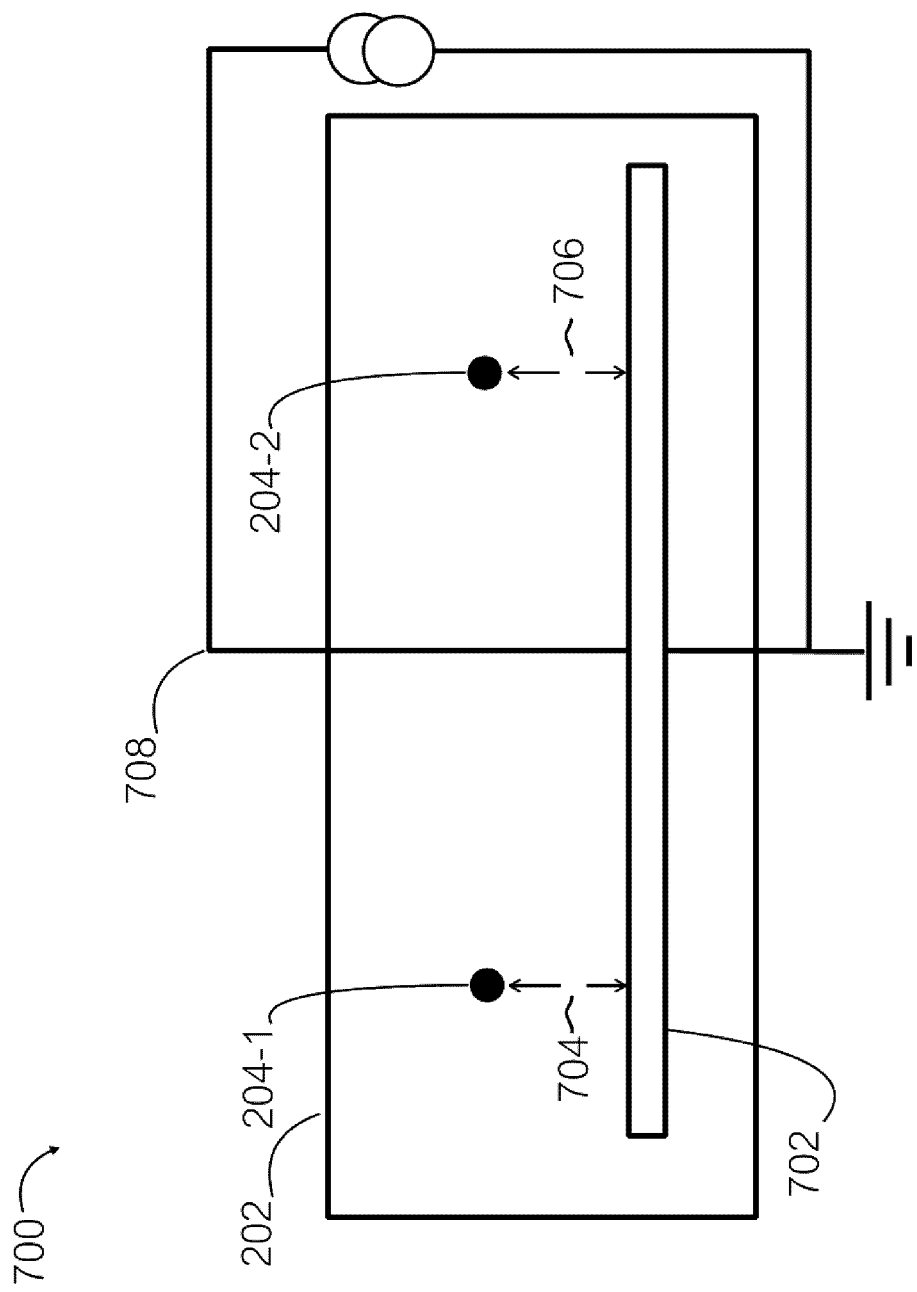
FIG. 7 is a schematic diagram illustrating a body of semiconductor material, a pair of exemplary defects, and a coupler.

FIG. 7 is a schematic diagram illustrating a quantum information processor 700. The quantum information processor 700 includes a semiconductor material 202, a pair of exemplary local luminescent defects 204-1 and 204-2, and a coupler 702. Coupler 702 includes an optical structure disposed in or on a semiconductor material 202 proximate to both luminescent defects 204-1 and 204-2. Defect 204-1 is spaced apart from coupler 702 by a distance 704 and defect 204-2 is spaced apart from coupler 702 by a distance 706. Distance 704 and distance 706 may be different. Distance 704 and/or distance 706 may be negligible. Defect 204-1 may be disposed on a first side of coupler 702 while defect 204-2 may be disposed on a second side of coupler 702. A controller may direct an input subsystem, e.g., processor(s) 105 may direct quantum input subsystem 156 to transmit a photon through coupler 702. When distances 704 and 706 are small enough given the refractive indices and physical layout of semiconductor material 202 and coupler 702 the photon in coupler 702 can couple to defects 204-1 and 204-2. Thus, a controller may effect or affect (e.g., cause or vary) a multi-qubit operation via a coupler photon disposed in the coupler 702. While one coupler (702) and two luminescent defects (204-1 and 204-2) are illustrated the quantum information processor 700 may include a different number of defects and couplers. For example, quantum information processor 700 may include three defects per coupler.

The controller may effect or affect (e.g., cause or vary) a multi-qubit operation via a virtual photon via the coupler 702 e.g., couple defects 204-1 and 204-2 via a vacuum state. The controller may control the multi-qubit operation by altering the optical properties of coupler 702. For example, by injecting carriers (e.g., electrons, holes) into coupler 702 via circuit 708 disposed in, on, or proximate to semiconductor material 202. The carriers vary the refractive index of the coupler 702, and effect or affect (e.g., cause or vary) multi-qubit operations by a virtual photon through the coupler 702.

Figure 8:
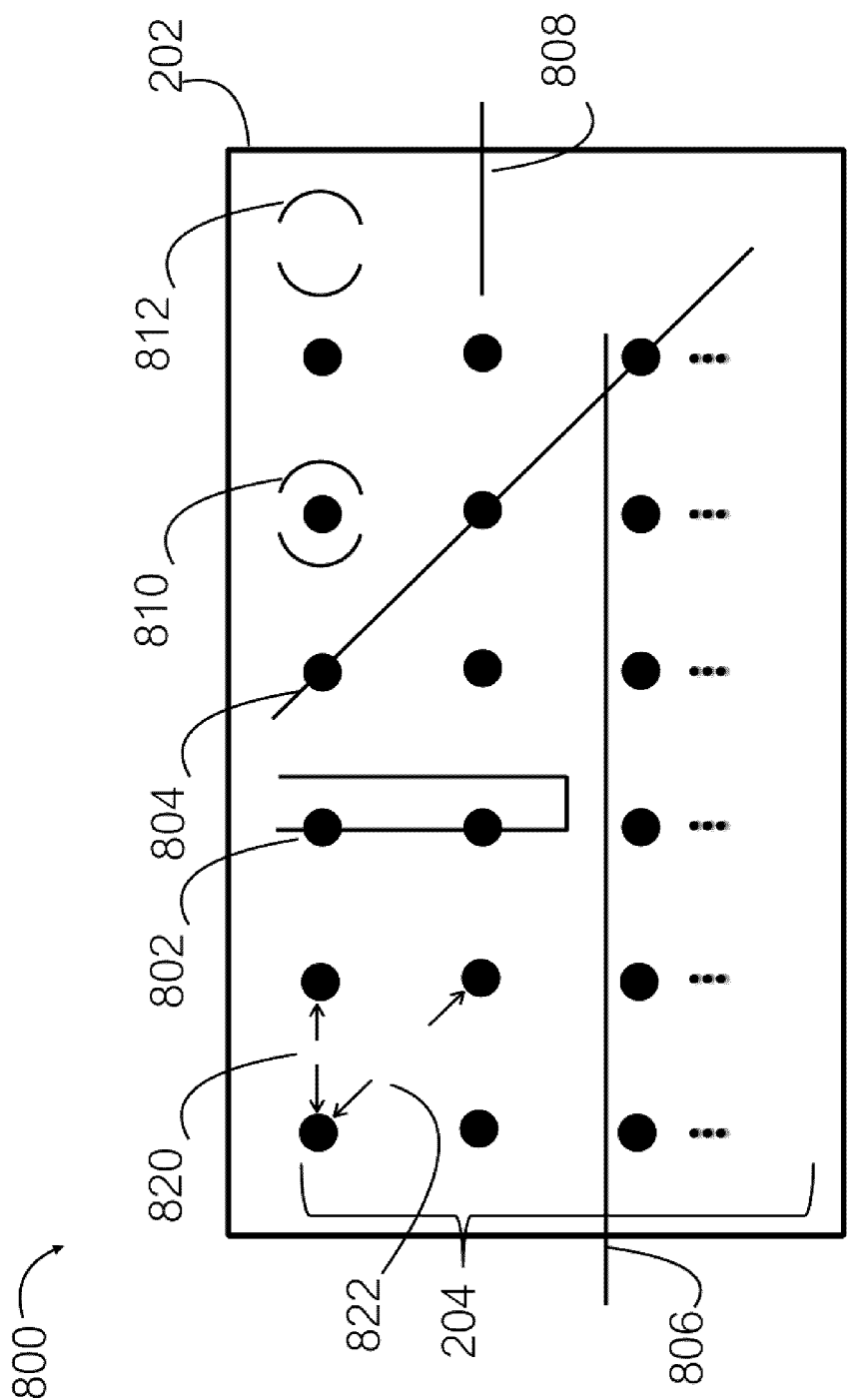
FIG. 8 is a schematic diagram illustrating a body of semiconductor material, a plurality of exemplary defects, and various optical structures.

FIG. 8 schematically illustrates a quantum information processor 800. Quantum information processor 800 includes semiconductor material 202, and a plurality of luminescent defects 204. The plurality of defects 204 includes a first defect, a second defect, etc. The plurality of defects 204 is shown in a regular two-dimensional array or lattice but can be in an irregular lattice by design or due to imprecision in manufacturing process. The plurality of defects 204 may have a logical lattice of one, two, or more dimensions. The plurality of defects 204 could extend in one, two, or three direction(s) in semiconductor material 202. Quantum information processor 800 includes various optical structures 802, 804, et seq. The optical structures can include waveguides and resonators. Waveguide 802 is proximate to (e.g., close enough for near-field or evanescent-wave interaction) at least one defect, as illustrated, a pair of defects 204. Waveguide 802 could be included in a coupler, for example, coupler 702. Waveguide 802 could be included in a readout device implementing the readout operations described in FIG. 1, FIG. 12, and the like.

Waveguide 804 (e.g., as defined in semiconductor material 202) is proximate to a plurality of luminescent defects 204. As illustrated waveguide 804 runs diagonally over some of defects 204 but need not extend in straight line or overlie the defects 204. Waveguide 806 is proximate a plurality of luminescent defects including defects 204. For example, the waveguide 806 could overlie semiconductor material 202 near the plurality of luminescent defects including defects 204. Waveguide 806 extends off semiconductor material 202 and may act as part of channel 170, quantum input system 156, and the like. Waveguide 808 may be disposed proximate to one luminescent defect included in the plurality of defects 204. Waveguide 808 may act as part of channel 170, quantum input system 156, and the like.

Quantum information processor 800 includes a resonator 810 around a first luminescent defect in the plurality of defects 204. The resonator 810 may be used to initialize, manipulate, or readout the state of the associated first luminescent defect. Quantum information processor 800 includes a resonator 812 proximate to a second luminescent defect in the plurality of luminescent defects 204. The resonator 812 may be used to initialize manipulate, or readout the state of the associated luminescent defect. In some implementations, a resonator and a waveguide are proximate to one or more luminescent defects.

In quantum information processor 800, the plurality of luminescent defects 204 are arranged in an array or lattice where each luminescent defect in the plurality of luminescent defects 204 is spaced away from another luminescent defect by one of a plurality of offsets or translations. For example, translation 820 and translation 822. In some implementations, the plurality of luminescent defects 204 all include the same computational states. The plurality of luminescent defects 204 may include a first set (e.g., one or more) of luminescent defects having a first pair of computational states, and a second set (e.g., one or more) of luminescent defects having a second pair of computational states. See description herein at, at least, FIG. 9. The plurality of luminescent defects 204 may include a respective luminescent defect including a plurality of respective qubits. For example, a first luminescent defect may include a first qubit that includes bound-exciton states, and the first luminescent defect may include a second qubit that includes nuclear spin states.

Figure 9:
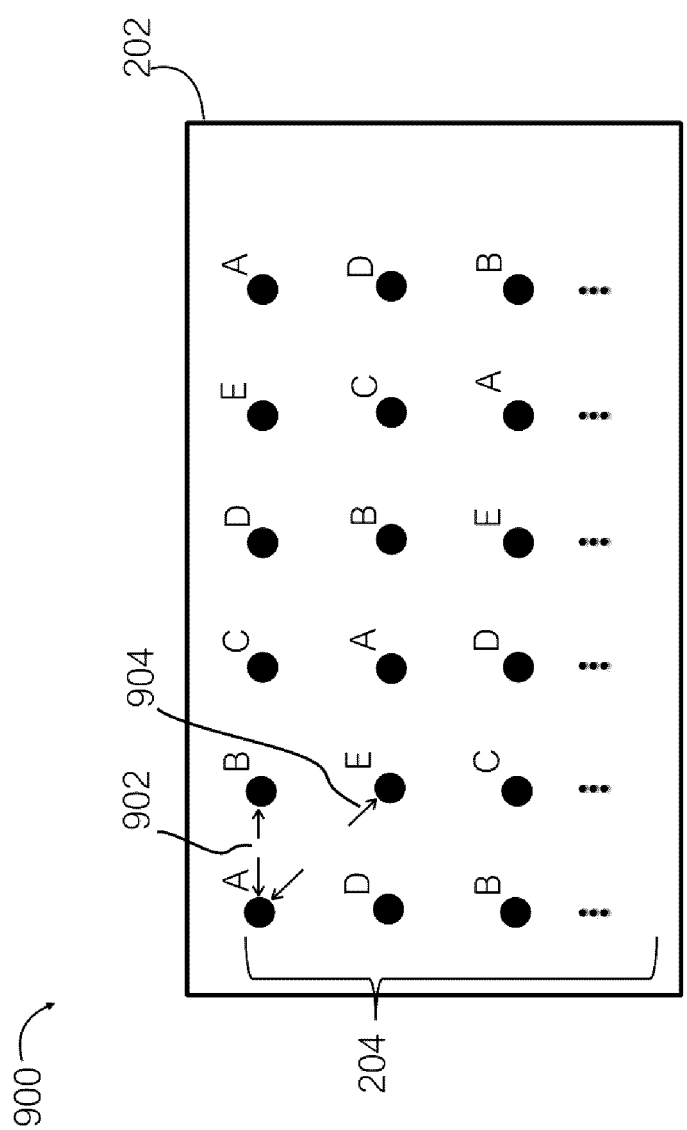
FIG. 9 is a schematic diagram illustrating a body of semiconductor material, and a plurality of exemplary defects having different computational states.

FIG. 9 schematically illustrates a quantum information processor 900. Quantum information processor 900 includes semiconductor material 202, a plurality of local luminescent defects 204 having different computational states. In quantum information processor 900, as illustrated, the plurality of defects 204 are arranged in an array or lattice defined by translation 902 and translation 904. The lattice may be a logical lattice or a physical lattice. In some implementations, the plurality of defects 204 all include a plurality of computational states (e.g., a first luminescent defect included in defects 204 may use Code 3 and a second luminescent defect may use Code 5 as shown in FIG. 4). For example, as shown in FIG. 9, there are five (5) types of computational states encoded in plurality of defects 204 (where each encoding is labelled A-E). As shown, from row to row in quantum information processor 900 the computational states for the luminescent defects at the start of the row varies. Like pairs of luminescent defects with the same computational states are spread out over quantum information processor 900. Since energy differences vary with computational states in general, single and multi qubit operations based on specific energy differences can be applied to some or all of quantum information processor 900 with a lower chance of affecting other (i.e., non-target) luminescent defects.

Figure 10:
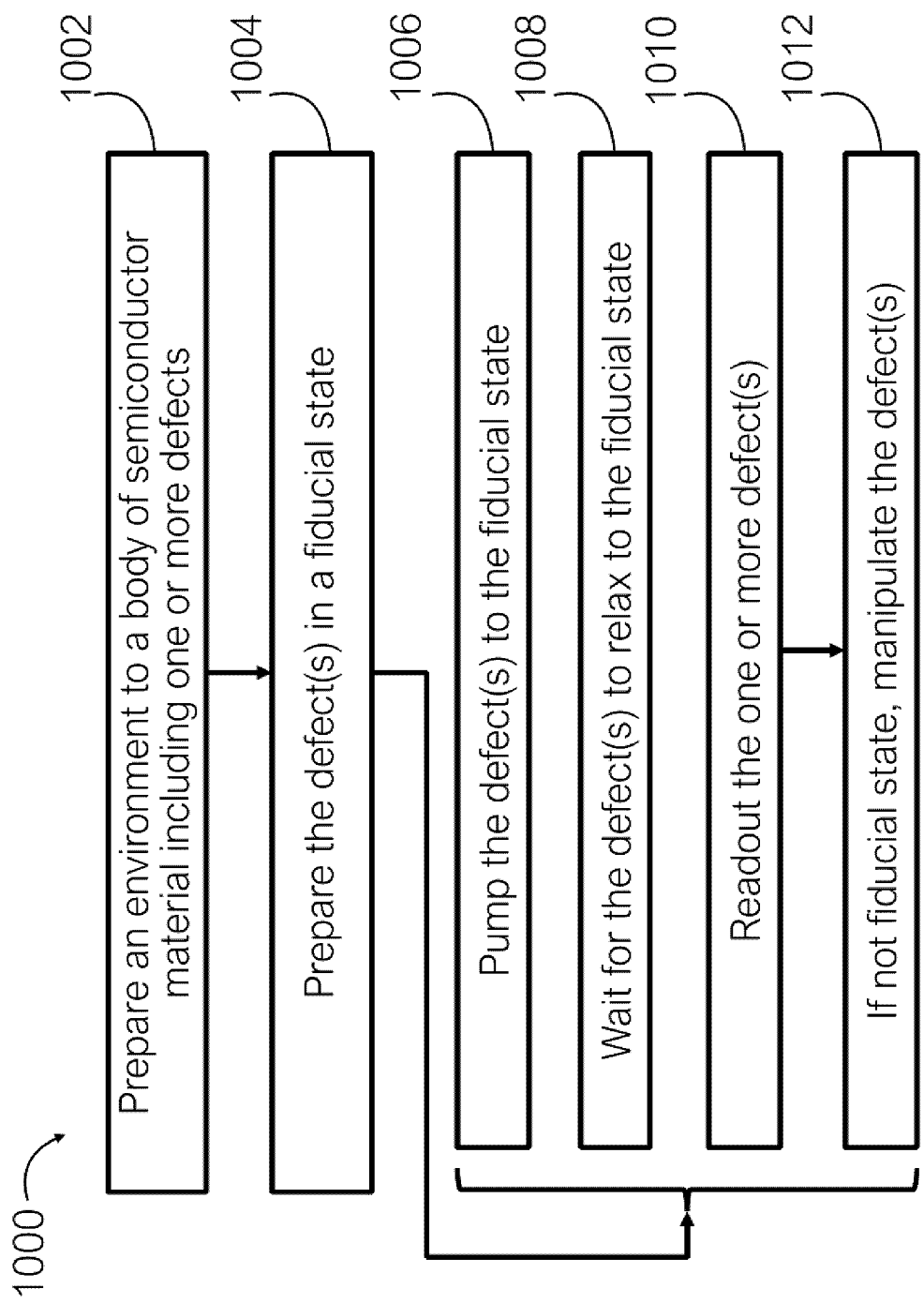
FIG. 10 is a flow-diagram illustrating an implementation of an example method of operation of a quantum information processor including one or more initialization operations.

FIG. 10 illustrates an example method 1000 (including, for example, acts 1002, 1004, . . . , etc.) of operation for a quantum information processor, such as, quantum information processors 200 and 800. For method 1000, as with other methods taught herein, the various acts may be performed in a different order than that illustrated and described. Additionally, the methods can omit some acts, and/or employ additional acts. One or more acts of method 1000 may be performed by or via one or more circuits, for instance, one or more hardware processors. In some implementations, method 1000 is performed by a controller, e.g., control subsystem 104 of system 100.

Method 1000 normally begins by invocation from a controller. At 1002, the controller prepares an environment of a silicon substrate including one or more luminescent defects. For example, the controller executes processor-executable instructions, which, when executed, causes an environment subsystem and/or quantum input subsystem 156 to prepare device 200. The controller may prepare the silicon substrate including one or more luminescent defects according to an electric profile, magnetic profile, thermal profile, or strain profile i.e., vary profile(s) for one or more of magnetic field, electric field, strain, and heat. The controller may, at 1002, prepare one or more luminescent defects in a specific charge state, e.g., neutral, ionized. For example, a luminescent defect in a neutral state may have one unpaired electron, and when singly ionized this electron is removed. The luminescent defect may be ionized by photoionization, applying carriers to surrounding silicon material, and the like.

At 1004, the controller prepares the one or more luminescent defects in a fiducial state that includes a specified number of bound-excitons. For example, a ground state which does not have any associated bound-excitons. That is, for a plurality of luminescent defects there is a fiducial state. For a representative luminescent defect in the one or more defects the fiducial state can include other degrees of freedom such as charge state, hole spin state, electron spin state, nuclear spin state, configuration state, and the like. The controller may prepare the one or more luminescent defects in the fiducial state in different ways including acts 1006, 1008, and 1010.

At 1006, the controller prepares the one or more luminescent defects in the fiducial state by executing processor-executable instructions, which when executed cause the input subsystem to pump the one or more luminescent defects to the fiducial state. For example, the processor(s) 105 may direct the quantum input subsystem 156 to use an optical or electrical input device to excite or elevate a luminescent defect into a computational state for a code shown in FIG. 4.

At 1008, the controller prepares the one or more luminescent defects in the fiducial state by executing processor-executable instructions, which when executed causes a quantum information processor to wait for the one or more luminescent defects to relax into the fiducial state.

At 1010, the controller prepares the one or more luminescent defects in the fiducial state by executing processor-executable instructions, which when executed causes a quantum information processor to readout the one or more luminescent defects. That is, measure the state of the one or more luminescent defects, such as, measure defect 204. The controller may read out the state of the one or more luminescent defects as described herein with reference to, at least, FIGS. 1, and 12. The controller may perform a parity measurement, e.g., measure an aggregate property for a plurality of luminescent defects in the one or more defects. Examples of parity measurements are described herein with reference to, at least, FIGS. 1 and 12.

If the state of the one or more defects is not the fiducial state then at 1012 the controller may manipulate the defect(s) into the fiducial state. For example, if a defect is measured by the controller and has state, $|1\rangle$, then the controller may perform a bit flip operation on the luminescent defect, e.g., $\sigma^x|1\rangle=|0\rangle$. Examples of single qubit operations are described herein with reference to, at least, FIGS. 11 and 13. Alternatively, if the state of the one or more defects is not the fiducial state then at 1012 the controller may manipulate the defect(s) based on the defect(s) being in another state, e.g., a second computational state.

Method 1000 ends until invoked again. Method 1000 may be followed by one or more other methods such as method 1100.

Figure 11:
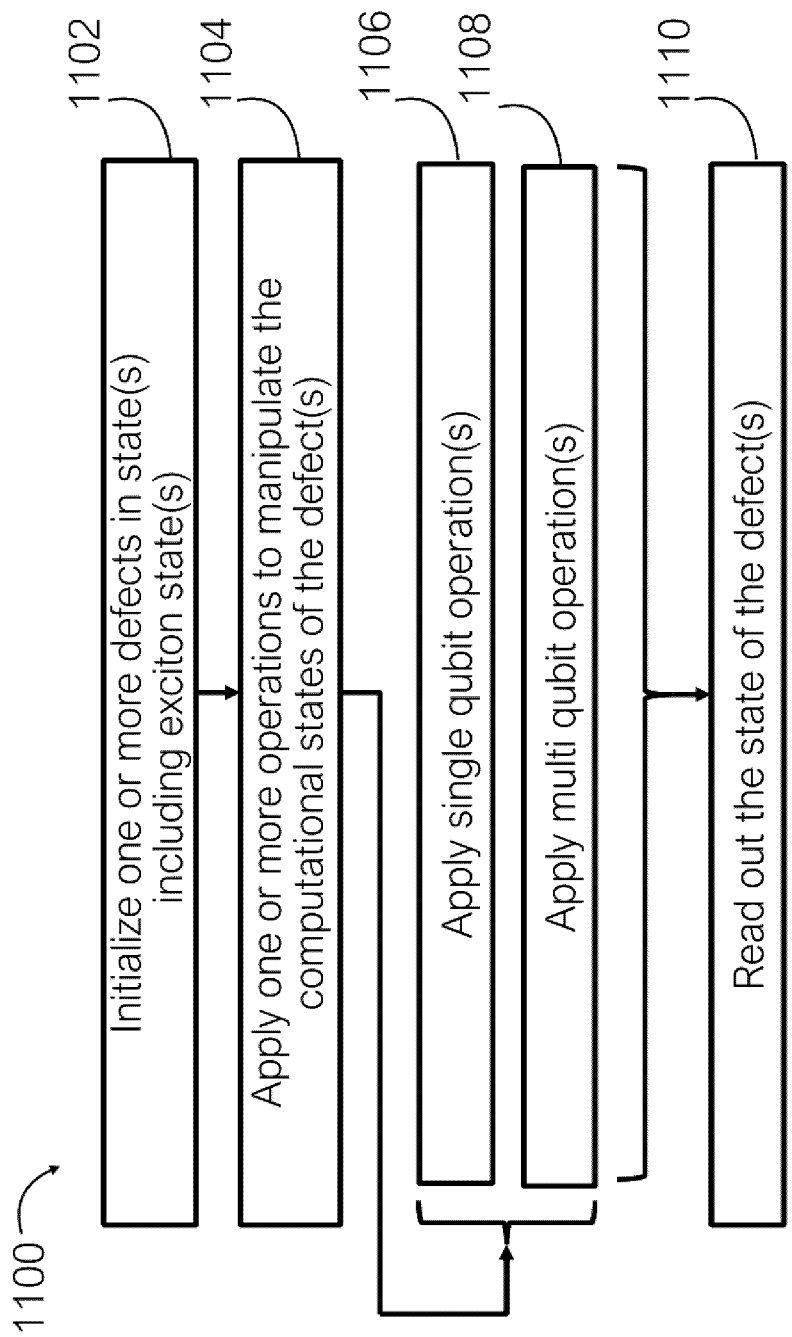
FIG. 11 is a flow-diagram illustrating an implementation of an example method of operation of a quantum information processor including one or more qubit operations.

FIG. 11 illustrates an example method 1100 (including, for example, acts 1102, 1104, etc.) for operation of a quantum information processor, such as, device 200, and quantum information processors 700 and 900. One or more acts of method 1100 may be performed by or via one or more circuits, for instance one or more hardware processors. In some implementations, method 1100 is performed by a controller, e.g., processor(s) 105 of system 100.

Method 1100 normally begins by invocation from a controller. At 1102, the controller initializes one or more luminescent defects into a computational state. For example, the controller prepares the one or more luminescent defects in a fiducial state that includes a local energy state. The controller may prepare the one or more luminescent defects in a fiducial state by performing method 1000.

At 1104, the controller applies one or more operations to manipulate the states of the one or more luminescent defects. For example, the controller executes processor-executable instructions, and in response to executing the processor-executable instructions, the controller directs one or more operations to manipulate the computational states of the one or more luminescent defects. At 1106, the controller applies one or more single qubit operations to manipulate the states of the one or more luminescent defects. At 1108, the controller applies one or more multi-qubit operations to manipulate the states of two or more luminescent defects. For example, processor(s) 105 can execute special information processor control instructions 130 to direct defect 204-1 and defect 204-2 in quantum information processor 700 to optically couple.

At 1110, the controller reads out the state of the one or more luminescent defects. Examples of how a controller reads out the state of the one or more luminescent defects is described herein in with reference to, at least, FIGS. 1, and 12.

Method 1100 ends until invoked again.

Figure 12:
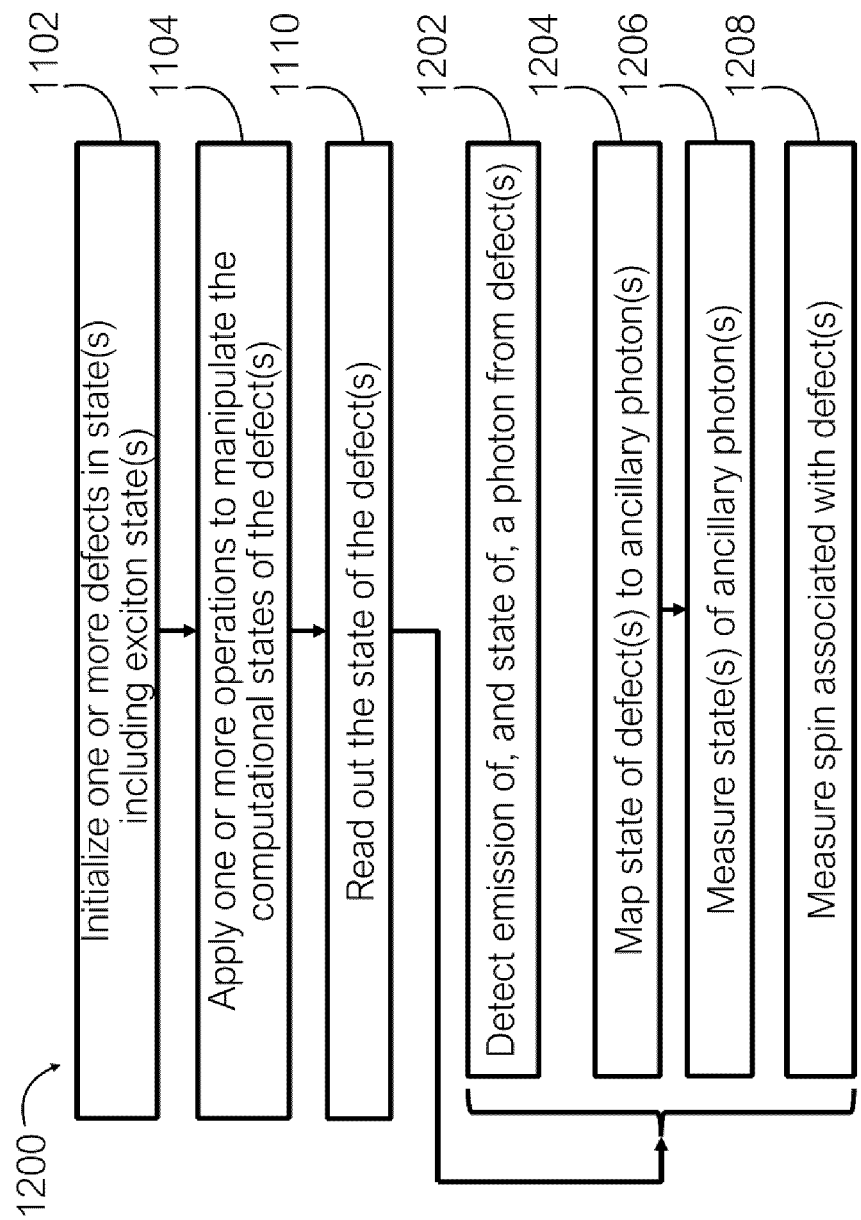
FIG. 12 is a flow-diagram illustrating an implementation of an example method of operation of a quantum information processor including one or more readout operations.

FIG. 12 illustrates an example method 1200 of operation for a quantum information processor, such as, quantum information processors 700 and 900. One or more acts of method 1200 (e.g., acts 1102, 1104, 1110, 1202, 1204) may be performed by or via one or more circuits, for instance one or more hardware processors. In some implementations, method 1200 is performed by a controller, e.g., control subsystem 104 of system 100.

Method 1200 normally begins by invocation from a controller. At 1102, the controller initializes one or more luminescent defects a fiducial state. At 1104, the controller applies one or more operations to manipulate the states of the one or more luminescent defects.

At 1110, the controller reads out the state of the one or more luminescent defects. The controller may read out the states of the one or more luminescent defects in different ways including acts 1202, 1204, 1206 and 1208. At 1202, the controller detects emission of, and state of, a photon from one luminescent defect in the one or more luminescent defects. For example, quantum output subsystem 158 includes a measurement device directed at waveguide 808 included in quantum information processor 800. At 1204, the controller maps a state of a luminescent defect included in the one or more luminescent defects to an ancillary photon. At 1208, the controller measures one or more spins associated with one or more luminescent defects. The state of the spin may indicate the computational (e.g. exciton) state of the luminescent defect. That is, the two computational states differ by a spin value, e.g., Code 4 shown in FIG. 4. Examples of measurement of one or more spins associated with one or more luminescent defects is described herein at least with reference to FIG. 15.

The controller at acts 1202, 1204, or 1206 may use measurement techniques known in quantum information processing. For example, the controller at acts 1202, 1204, or 1206 may perform a parity measurement, e.g., measure an aggregate property for a plurality of luminescent defects in the one or more defects. Examples of parity measurements are described herein at, at least, FIGS. 1 and 12. The controller at acts 1202, 1204, or 1206 may measure in a superposition basis. The controller at acts 1202, 1204, or 1206 may measure a first luminescent defect via an associated component, such as, an optical structure, or an ancillary or reporter luminescent defect. Method 1200 ends until invoked again.

Figure 13:
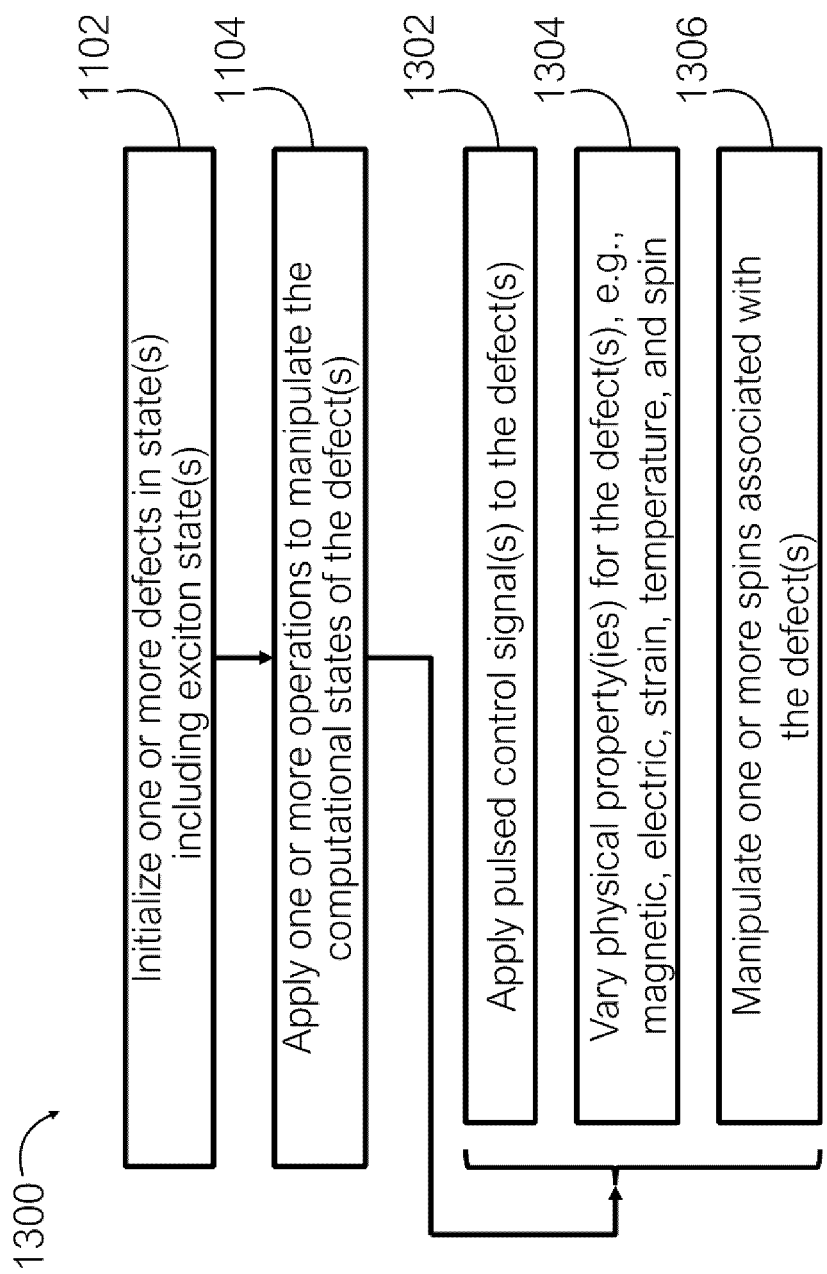
FIG. 13 is a flow-diagram illustrating an implementation of an example method of operation of a quantum information processor including one or more single qubit operations.

FIG. 13 illustrates an example method 1300 of operation for a quantum information processor, such as, device 200, quantum information processors 700, 800 and 900. One or more acts of method 1300 (e.g., acts 1102, 1106, 1302, 1304, etc.) may be performed by or via one or more circuits, for instance one or more hardware processors. In some implementations, method 1300 is performed by a controller, e.g., processor(s) 105 of system 100. In some implementations, the processor(s) 105 executes the quantum information processor control instructions 130 and in response system 100 performs method 1300.

FIG. 13 illustrates, amongst other parts, examples of act 1106 of a quantum information processor, such as, device 200, quantum information processors 800, and 900.

Method 1300 normally begins by invocation from a controller. At 1102, the controller initializes one or more luminescent defects in a fiducial state. At 1106, the controller applies one or more single qubit operations to manipulate the state(s) of the one or more luminescent defects. The controller may apply one or more single qubit operations to manipulate the states of the one or more luminescent defects in different ways including acts 1302, 1304, and 1306.

At 1302 the controller applies (or causes to be applied) pulsed signals to the one or more luminescent defects. Pulsed signals are time varying signals (e.g., shaped) at the appropriate frequency (e.g., near the energy difference for the computational states) with appropriate phase and duration to effect a gate operation. For example, the controller could effect a pi/2 sigma-X pulse on the one or more luminescent defects. The pulsed signals can be implemented via the magnetic manipulation subsystem, including coil 210, antenna 212, and a waveform generator, such as, a Tektronix AWG5200 generator, available from Tektronix, Inc. of Beaverton, Oreg., US.

The controller, at 1302, can cause signals to be applied at an appropriate frequency, such as, a frequency corresponding to the energy difference between the computational states of a qubit in the qubit's rotating frame. For example, the qubit may be driven by a series of pulses along a path defined on the Bloch sphere with the effect of changing the effective difference in energy between computational states. Such a driven qubit can be manipulated by near resonant signals to this changed energy difference.

The controller may, at 1302, apply signals through the sum or difference of two primary signals. For example, the controller cause and input subsystem to apply two pulses that differ in frequency by a "near-computational" frequency difference.

In some implementations, the controller affects a single qubit operation by going through an intermediate (temporary) state as indicated by transition 562, transition 564, and temporary state 557 shown in FIG. 5B. That is, the controller applies, via an input subsystem, a plurality of pulses. For example, the first pulse includes a first frequency corresponding to an energy difference between the first computational state and the temporary state. The second pulse includes a second frequency related to an energy difference between the temporary state and the first second computational state.

At 1304 the controller varies (or causes to be varied) physical conditions for the one or more luminescent defects. For example, the controller can direct the quantum input subsystem 156 to vary the profile for magnetic field, electric field, strain, and heat. For example, the controller could cause electrodes 208 to vary the electric field for defect 204. The controller could operate light source 206 to vary the electric field for defect 204. In some implementations, the controller could vary the magnetic field profile via one or more magnetic input components such as coil 210.

The controller could vary the strain profile (e.g., strength, location, gradient, anisotropy) via one more mechanical input devices. In some implementations, the controller could vary the thermal profile for one or more quantum information processors. For example, the controller could cause heater 217 and cooler 218 to vary the temperature of the luminescent defect.

At 1306, the controller manipulates (or causes to be manipulated) spins associated with the one or more luminescent defects. The controller could apply (or cause to be applied) pulsed signals to the one or more luminescent defects. The pulsed signals can be implemented via the magnetic manipulation subsystem, coil 210, and antenna 212. The pulse signals could be directed at the electron spin or the hole spin or the nuclear spin associated with the one or more luminescent defects. The controller may map information from the computational (e.g. exciton) states associated with the one or more luminescent defects to one or more spin states, manipulate the one or more one or more spin states, and map the one or more one or more spin states back to computational states of the one or more luminescent defects. The controller may map information from a first set of computational states associated with the one or more luminescent defects to a second set of computational states, manipulate the information within this second set of computational states, and map the information back to the first set of computational states of the one or more luminescent defects. In other words, at 1306, the controller manipulates a luminescent defect by temporarily manipulating an associated degree of freedom such as spin to impart a phase onto a superposition of computational (e.g. exciton) states. The controller can, at 1306, manipulate other ancillary degrees of freedom.

Method 1300 ends until invoked again.

Figure 14:
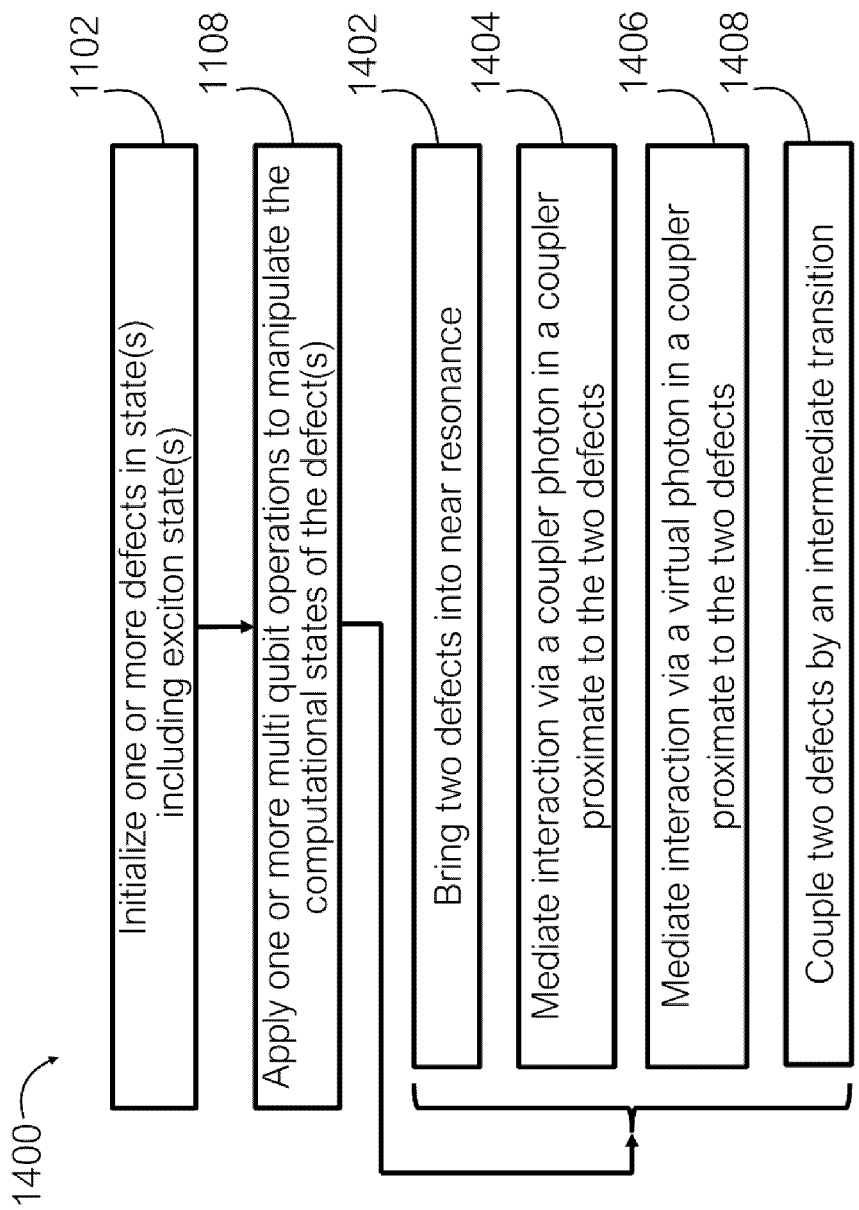
FIG. 14 is a flow-diagram illustrating an implementation of an example method of operation of a quantum information processor including one or more multi-qubit operations.

FIG. 14 illustrates an example method 1400 for operation for a quantum information processor, such as, quantum information processors 700, 800 and 900. One or more acts of method 1400 (e.g., acts 1102, 1108, 1402, 1404, . . . , etc.) may be performed by or via one or more circuits, for instance one or more hardware processors. In some implementations, method 1400 is performed by a controller, e.g., control subsystem 104 of system 100. In some implementations, the control subsystem 104 executes the quantum information processor control instructions 130 and in response system 100 performs method 1400.

FIG. 14 illustrates, amongst other parts, examples of act 1108 for a quantum information processor, such as, device 200, quantum information processors 700, and 900.

Method 1400 normally begins by invocation from a controller. At 1102, the controller initializes one or more luminescent defects in a fiducial state. At 1108, the controller applies one or more multi-qubit operations to manipulate the states of the two or more luminescent defects. The controller may apply one or more multi-qubit operations to manipulate the states of the two or more luminescent defects in different ways including acts 1402, 1404, 1406, and 1408. Herein reference to two includes two or more unless the context dictates otherwise.

At 1402, the controller brings two luminescent defects into near resonance. For example, the controller could bring a defect 204 of type A and a defect 204 of type B shown in FIG. 9 into near resonance. The controller could vary an electric field and/or magnetic field and/or strain for one or more of the two luminescent defects. The first luminescent defect can have a first transition between a pair of computational states and the second luminescent defect can have a second transition between another pair of computational states. The pairs of computational states can be logically equivalent, e.g., two pairs of $|0\rangle$ and $|1\rangle$, that may be based on the same or different energy states. The controller can cause the first transition to be brought into resonance with the second transition. That is, the resonance condition can be for the energy difference between the first computational states and the second computational state of the respective luminescent defects. The controller can bring two or more luminescent defects into near resonance by driving the first transition of the first luminescent defects at or nearly at the frequency of the second transition of the second luminescent defect. The controller can bring two or more luminescent defects into near resonance by driving the two or more luminescent defects at or nearly at the same rotation frequency. The controller can bring two or more luminescent defects into near resonance for a transition in a respective luminescent defect's rotating frame. See S. R. Hartmann and E. L. Hahn, 1962 "Nuclear Double Resonance in the Rotating Frame" *Phys. Rev.* 128:2042-2053.

At 1404, the controller mediates interaction of two luminescent defects via a coupler photon in a coupler proximate to the two luminescent defects. For example, coupler 702, an optical structure, disposed proximate to a first defect 204-1 and a second defect 204-2, and communicatively coupled to an input subsystem, e.g., quantum input subsystem 156. The controller could, in response to executing processor-executable instructions, direct the input subsystem to couple the first luminescent defect and the second luminescent defect via at least one coupler photon disposed in the coupler.

At 1406, the controller mediates interaction of two luminescent defects via a virtual photon in a coupler proximate to the two luminescent defects. The controller could, in response to executing processor-executable instructions, direct the input subsystem to couple the first luminescent defect and the second luminescent defect via a virtual photon disposed in the coupler. That is, the first luminescent defect and the second luminescent defect interact via a vacuum state of the coupler. The controller may effect the multi-qubit operation by, e.g., straining the coupler, or varying carriers in the coupler as shown and described in, at least, FIG. 7.

At 1408, the controller couples two luminescent defects via an intermediate transition. For example, a coupler includes a transition that is selectively in resonance with transitions in the first and second luminescent defect. The controller may cause an input subsystem to bring a first transition for a first luminescent defect, a second transition for a second luminescent defect, and the third intermediate coupler transition into near resonance. Method 1400 ends until invoked again.

Figure 15:
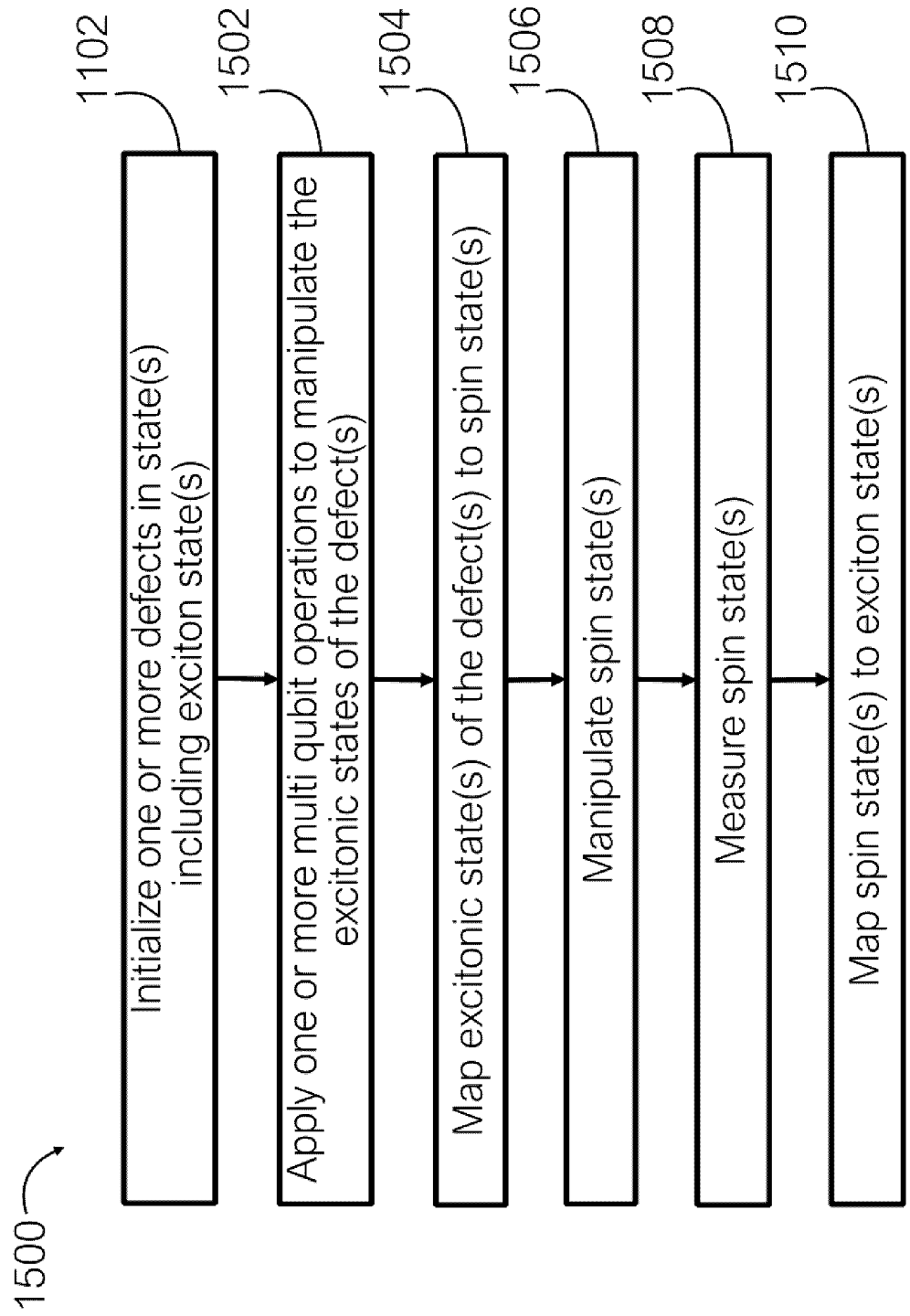
FIG. 15 is a flow-diagram illustrating an implementation of an example method of operation of a quantum information processor, where the method includes a transfer of information from a ground and/or exciton states to spin state or vice versa.

FIG. 15 illustrates an example method 1500 of operation for a quantum information processor, such as, quantum information processors 800 and 900. One or more acts of method 1500 (e.g., acts 1102, 1502, 1504, . . . , etc.) may be performed by or via one or more circuits, for instance one or more hardware processors. One or more acts of method 1500 may be performed by or via one or more circuits, for instance one or more hardware processors. In some implementations, method 1500 is performed by a controller, e.g., processor 105 of system 100. In some implementations, processor 105 executes the special information processor control instructions 130 and in response system 100 performs method 1500.

FIG. 15 illustrates, amongst other parts, an implementation of a method for operation in quantum information processor, such as, quantum information processors 700, and 900. Method 1500 includes acts that map information from computational (e.g. exciton) states to spin states, and/or vice versa.

Method 1500 normally begins by invocation from a controller. At 1102, the controller initializes one or more luminescent defects in a fiducial state. At 1502, an optional act, the controller applies one or more operations to manipulate the computational states of the one or more luminescent defects. At 1504, the controller maps the computational (e.g. exciton) states of the one or more luminescent defects to one or more spin states of the one or more luminescent defects. At 1506, an optional act, the controller manipulates the spin states of the one or more luminescent defects. For example, the quantum input subsystem 156 manipulates a first linear combination of the first spin state and the second spin state into a second linear combination of spin states.

At 1508, an optional act, the controller causes an output subsystem, e.g., output subsystem 158, to measure one or more spin state the one or more luminescent defects. Examples of measurement of one or more spins associated with one or more luminescent defects is described herein at least with reference to FIG. 12. At 1510, the controller maps the one or more spin states of the one or more luminescent defects to the computational (e.g. excitonic) states of the one or more luminescent defects.

Method 1500 ends until invoked again. Method 1500 may be followed by other methods or acts such as those described with reference to FIG. 12.

Unless otherwise specified herein, or unless the context clearly dictates otherwise the term about modifying a numerical quantity means plus or minus ten (10) percent. Unless otherwise specified, or unless the context dictates otherwise, between two numerical values is to be read as between and including the two numerical values.

In the above description, some specific details are included to provide an understanding of various disclosed implementations. One skilled in the relevant art, however, will recognize that implementations may be practiced without one or more of these specific details, parts of a method, components, materials, etc. In some instances, well-known structures associated with semiconductor and/or optical devices and/or quantum computing and/or quantum information processing, such as targets, substrates, lenses, waveguides, shields, filters, lasers, processor-executable instructions (e.g., BIOS, drivers), have not been shown or described in detail to avoid unnecessarily obscuring descriptions of the disclosed implementations.

In this specification and appended claims "a", "an", "one", or "another" applied to "embodiment", "example", or "implementation" is used in the sense that a particular referent feature, structure, or characteristic described in connection with the embodiment, example, or implementation is included in at least one embodiment, example, or implementation. Thus, phrases like "in one embodiment", "in an embodiment", or "another embodiment" are not necessarily all referring to the same embodiment. Furthermore, the particular features, structures, or characteristics may be combined in any suitable manner in one or more embodiments, examples, or implementations.

As used in this specification and the appended claims, the singular forms of articles, such as "a", "an", and "the", include plural referents unless the context mandates otherwise. It should also be noted that the term "or" is generally employed in its sense including "and/or" unless the context mandates otherwise.

Unless the context requires otherwise, throughout this specification and appended claims, the word "comprise" and variations thereof, such as, "comprises" and "comprising" are to be interpreted in an open, inclusive sense, that is, as "including, but not limited to".

All of the US patents, US patent application publications, US patent applications, foreign patents, foreign patent applications, and non-patent publications referred to in this specification, or referred to on any application data sheet, including PCT publication WO2017089891A1 and PCT application serial number PCT/IB2019/054312 are incorporated by reference in their entireties for all purposes herein.

While certain features of the described embodiments and implementations have been described herein, many modifications, substitutions, changes and equivalents will now occur to those skilled in the art. It is, therefore, to be understood that the appended claims are intended to cover all such modifications and changes as fall within the scope of the described embodiments and implementations.

Interpretation of Terms

Unless the context clearly requires otherwise, throughout the description and the claims:
"comprise", "comprising", and the like are to be construed in an inclusive sense, as opposed to an exclusive or exhaustive sense; that is to say, in the sense of "including, but not limited to";
"connected", "coupled", or any variant thereof, means any connection or coupling, either direct or indirect, between two or more elements; the coupling or connection between the elements can be physical, logical, or a combination thereof;
"herein", "above", "below", and words of similar import, when used to describe this specification, shall refer to this specification as a whole, and not to any particular portions of this specification;
"or", in reference to a list of two or more items, covers all of the following interpretations of the word: any of the items in the list, all of the items in the list, and any combination of the items in the list;
the singular forms "a", "an", and "the" also include the meaning of any appropriate plural forms.

Words that indicate directions such as "vertical", "transverse", "horizontal", "upward", "downward", "forward", "backward", "inward", "outward", "left", "right", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

Embodiments of the invention may be implemented using specifically designed hardware, configurable hardware, programmable data processors configured by the provision of software (which may optionally comprise "firmware") capable of executing on the data processors, special purpose computers or data processors that are specifically programmed, configured, or constructed to perform one or more steps in a method as explained in detail herein and/or combinations of two or more of these. Examples of specifically designed hardware are: logic circuits, application-specific integrated circuits ("ASICs"), large scale integrated circuits ("LSIs"), very large scale integrated circuits ("VLSIs"), and the like. Examples of configurable hardware are: one or more programmable logic devices such as programmable array logic ("PALs"), programmable logic arrays ("PLAs"), and field programmable gate arrays ("FPGAs"). Examples of programmable data processors are: microprocessors, digital signal processors ("DSPs"), embedded processors, graphics processors, math co-processors, general purpose computers, server computers, cloud computers, mainframe computers, computer workstations, and the like. For example, one or more data processors in a control circuit for a device may implement methods as described herein by executing software instructions in a program memory accessible to the processors.

Processing may be centralized or distributed. Where processing is distributed, information including software and/or data may be kept centrally or distributed. Such information may be exchanged between different functional units by way of a communications network, such as a Local Area Network (LAN), Wide Area Network (WAN), or the Internet, wired or wireless data links, electromagnetic signals, or other data communication channel.

For example, while processes or blocks are presented in a given order, alternative examples may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

In addition, while elements are at times shown as being performed sequentially, they may instead be performed simultaneously or in different sequences. It is therefore intended that the following claims are interpreted to include all such variations as are within their intended scope.

Software and other modules may reside on servers, workstations, personal computers, tablet computers, image data encoders, image data decoders, PDAs, color-grading tools, video projectors, audio-visual receivers, displays (such as televisions), digital cinema projectors, media players, and other devices suitable for the purposes described herein. Those skilled in the relevant art will appreciate that aspects of the system can be practised with other communications, data processing, or computer system configurations, including: Internet appliances, hand-held devices (including personal digital assistants (PDAs)), wearable computers, all manner of cellular or mobile phones, multi-processor systems, microprocessor-based or programmable consumer electronics (e.g., video projectors, audio-visual receivers, displays, such as televisions, and the like), set-top boxes, color-grading tools, network PCs, mini-computers, mainframe computers, and the like.

The invention may also be provided in the form of a program product. The program product may comprise any non-transitory medium which carries a set of computer-readable instructions which, when executed by a data processor, cause the data processor to execute a method of the invention. Program products according to the invention may be in any of a wide variety of forms. The program product may comprise, for example, non-transitory media such as magnetic data storage media including floppy diskettes, hard disk drives, optical data storage media including CD ROMs, DVDs, electronic data storage media including ROMs, flash RAM, EPROMs, hardwired or preprogrammed chips (e.g., EEPROM semiconductor chips), nanotechnology memory, or the like. The computer-readable signals on the program product may optionally be compressed or encrypted.

In some embodiments, the invention may be implemented in software. For greater clarity, "software" includes any instructions executed on a processor, and may include (but is not limited to) firmware, resident software, microcode, and the like. Both processing hardware and software may be centralized or distributed (or a combination thereof), in whole or in part, as known to those skilled in the art. For example, software and other modules may be accessible via local memory, via a network, via a browser or other application in a distributed computing context, or via other means suitable for the purposes described above.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of systems, methods and apparatus have been described herein for purposes of illustration. These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

Various features are described herein as being present in "some embodiments". Such features are not mandatory and may not be present in all embodiments. Embodiments of the invention may include zero, any one or any combination of two or more of such features. This is limited only to the extent that certain ones of such features are incompatible with other ones of such features in the sense that it would be impossible for a person of ordinary skill in the art to construct a practical embodiment that combines such incompatible features. Consequently, the description that "some embodiments" possess feature A and "some embodiments" possess feature B should be interpreted as an express indication that the inventors also contemplate embodiments which combine features A and B (unless the description states otherwise or features A and B are fundamentally incompatible).

It is therefore intended that the following appended claims and claims hereafter introduced are interpreted to include all such modifications, permutations, additions, omissions, and sub-combinations as may reasonably be inferred. The scope of the claims should not be limited by the preferred embodiments set forth in the examples, but should be given the broadest interpretation consistent with the description as a whole.

What is claimed is:

1. An information processing device comprising:
a semiconductor body consisting principally of silicon;
one or more local luminescent defects disposed within the semiconductor body, wherein the one or more luminescent defects are one or more radiation damage centres, wherein:
a respective local luminescent defect included in the one or more local luminescent defects is associated with a respective first bound exciton-state corresponding to a first configuration for one or more bound excitons localized at the respective local luminescent defect,
the respective local luminescent defect has a first computational state and a second computational state, and
the first computational state corresponds to the respective first bound exciton state and the second computational state differs from the first computational state at least by a degree of freedom of the respective first bound exciton state; and
a control system, including circuitry, communicatively coupled to the semiconductor body, the control system configured by processor-executable instructions to manipulate the one or more local luminescent defects to store quantum information in a quantum state of the one or more local luminescent defects that comprises the first computational state, the second computational state or a superposition of the first and second computational states.

2. The device of claim 1, wherein the degree of freedom of the respective first bound exciton state comprises an exciton number representing a number of bound excitons associated with the local luminescent defect, wherein the exciton number can be a positive integer or zero.

3. The device of claim 1, wherein the semiconductor body consists principally of natural silicon.

4. The device of claim 1, wherein the semiconductor body consists principally of purified silicon.

5. The device of claim 1, wherein the one or more local luminescent defects are selected from the group consisting of interstitial defects, and vacancy defects.

6. The device of claim 1, wherein the one or more local luminescent defects are substitutional defects.

7. The device of claim 1, wherein the one or more local luminescent defects disposed within the semiconductor body are T-centres.

8. The device of claim 1, wherein the one or more local luminescent defects disposed within the semiconductor body are selected from the group consisting of: C centres, F centres, G centres, I3 centres, P centres, W centres, X centres, Ga1 centres, Al1 centres, I centres, M centres, and N-C centres.

9. The device of claim 1, further comprising a waveguide optically coupled to the one or more local luminescent defects.

10. The device of claim 1, wherein the control system is configured by the processor executable instructions to measure a quantum state of one or more of the one or more local luminescent defects.

11. The device of claim 1, wherein the control system is configured by the processor executable instructions to manipulate information stored in the computational states of the one or more local luminescent defects.

12. The device of claim 11 wherein the control system is configured by the processor executable instructions to cause a change of a number of bound excitons associated with one or more of the one or more local luminescent defects.

13. The device of claim 11 wherein the control system is configured by the processor executable instructions to manipulate a representative local luminescent defect included in the at least one local luminescent defect into a combination of the first computational state and the second computational state of the representative local luminescent defect.

14. The device of claim 13 wherein the second computational state of the representative local luminescent defect corresponds to a configuration that does not include a bound exciton.

15. The device of claim 13 wherein the first computational state of the representative local luminescent defect and the second computational state of the representative local luminescent defect are respectively associated with different numbers of bound excitons localized at the representative local luminescent defect.

16. The device of claim 13 wherein the first computational state of the representative local luminescent defect is associated with an electron spin of a bound exciton and the second computational state of the representative local luminescent defect is associated with a hole spin of a bound exciton.

17. The device of claim 13 wherein the first computational state of the representative local luminescent defect and the second computational state of the representative local luminescent defect differ by a spin of an electron of the one or more bound exciton associated with the representative local luminescent defect.

18. The device of claim 13 wherein the first computational state of the representative local luminescent defect and the second computational state of the representative local luminescent defect differ by a spin of a hole of the one or more bound exciton associated with the representative local luminescent defect.

19. The device of claim 18 wherein, in the first computational state, two electrons associated with the respective luminescent defect are paired in a spin singlet.

20. The device of claim 13 wherein the first computational state of the representative local luminescent defect and the second computational state of the representative local luminescent defect differ by a spin flip.

21. The device of claim 13 wherein the first computational state of the representative local luminescent defect and the second computational state of the representative local luminescent defect differ by both of an electron spin of the one or more bound exciton and a nuclear spin associated with the representative local luminescent defect.

22. The device of claim 1, wherein the degree of freedom of the respective first bound exciton state comprises a spin of an electron or a hole of the one or more bound excitons associated with the respective first bound exciton state.

* * * * *